(12) United States Patent  
Dando et al.

(10) Patent No.: US 7,560,371 B2
(45) Date of Patent: Jul. 14, 2009

(54) METHODS FOR SELECTIVELY FILLING APERTURES IN A SUBSTRATE TO FORM CONDUCTIVE VIAS WITH A LIQUID USING A VACUUM

(75) Inventors: Ross S. Dando, Nampa, ID (US); Steven Oliver, Boise, ID (US); Swarnal Borthakur, Boise, ID (US); Kevin Hutto, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 11/511,619

(22) Filed: Aug. 29, 2006

(65) Prior Publication Data

US 2008/0057691 A1    Mar. 6, 2008

(51) Int. Cl.
*H01L 21/20* (2006.01)
(52) U.S. Cl. ............... 438/612; 438/613; 438/614; 438/108; 438/113; 257/E23.075; 257/E23.067; 257/E23.174
(58) Field of Classification Search .............. 438/14, 438/15, 17, 108–113, 612–614; 257/23.075, 257/67, 174
See application file for complete search history.

(56) References Cited

U.S. PATENT DOCUMENTS

| 4,072,777 | A | 2/1978 | Schoenthaler |
| 4,447,001 | A | 5/1984 | Allen et al. |
| 4,526,313 | A | 7/1985 | Hug et al. |
| 4,529,116 | A | 7/1985 | Gutbier |
| 4,659,003 | A | 4/1987 | Simonetti |
| 4,886,201 | A | 12/1989 | Deambrosio et al. |
| 5,023,848 | A | 6/1991 | Frey et al. |

(Continued)

FOREIGN PATENT DOCUMENTS

WO    WO 03/017367 A1    2/2003

(Continued)

OTHER PUBLICATIONS

U.S. Appl. No. 11/446,003, filed Jun. 1, 2006, entitled "Microelectronic Workpieces and Methods and Systems for Forming Interconnects in Microelectronic Workpieces."

(Continued)

*Primary Examiner*—Michael S Lebentritt
(74) *Attorney, Agent, or Firm*—TraskBritt

(57) ABSTRACT

Methods of forming a conductive via in a substrate include contacting the substrate with a wave of conductive liquid material, such as molten solder, and drawing the liquid material into the aperture with a vacuum. The wave may be formed by flowing the liquid material out from an outlet in a direction generally against the gravitational field. The liquid material may be solidified to form an electrically conductive structure. A plurality of apertures may be selectively filled with the liquid material one at a time, and liquids having different compositions may be used to provide conductive vias having different compositions in the same substrate. Systems for forming conductive vias include a substrate fixture, a vacuum device having a vacuum fixture, and a solder-dispensing device configured to provide a wave of molten solder material. Relative lateral and vertical movement is provided between the wave of molten solder and a substrate supported by the substrate fixture.

32 Claims, 11 Drawing Sheets

U.S. PATENT DOCUMENTS

| | | |
|---|---|---|
| 5,128,831 A | 7/1992 | Fox, III et al. |
| 5,292,686 A | 3/1994 | Riley et al. |
| 5,320,981 A | 6/1994 | Blalock |
| 5,388,468 A | 2/1995 | Sasson |
| 5,397,049 A | 3/1995 | Gileta et al. |
| 5,468,681 A | 11/1995 | Pasch |
| 5,533,663 A | 7/1996 | Massini, Jr. et al. |
| 5,538,175 A | 7/1996 | Massini, Jr. et al. |
| 5,568,894 A | 10/1996 | Gileta |
| 5,617,988 A | 4/1997 | Willemen |
| 5,740,730 A | 4/1998 | Thompson, Sr. |
| 5,758,413 A * | 6/1998 | Chong et al. ................ 29/852 |
| 5,775,568 A | 7/1998 | Asla et al. |
| 5,901,899 A | 5/1999 | Flache |
| 5,916,425 A * | 6/1999 | Leader et al. .......... 204/403.01 |
| 5,920,123 A | 7/1999 | Moden |
| 5,972,482 A * | 10/1999 | Hatakeyama et al. ....... 428/209 |
| 5,979,740 A | 11/1999 | Rooks |
| 5,988,480 A | 11/1999 | Farnworth |
| 6,002,177 A | 12/1999 | Gaynes et al. |
| RE36,644 E | 4/2000 | Dennison |
| 6,051,114 A | 4/2000 | Yao et al. |
| 6,082,605 A | 7/2000 | Farnworth |
| 6,085,960 A | 7/2000 | Kim et al. |
| 6,094,832 A | 8/2000 | Regner et al. |
| 6,119,915 A | 9/2000 | Thompson, Sr. |
| 6,171,964 B1 | 1/2001 | Gonzalez et al. |
| 6,187,678 B1 | 2/2001 | Gaynes et al. |
| 6,236,115 B1 | 5/2001 | Gaynes et al. |
| 6,310,484 B1 * | 10/2001 | Akram et al. ................ 324/754 |
| 6,325,271 B1 | 12/2001 | Farnworth |
| 6,331,482 B1 | 12/2001 | Honeycutt et al. |
| 6,372,624 B1 | 4/2002 | Farnworth et al. |
| 6,380,060 B1 * | 4/2002 | Zohni ......................... 438/612 |
| 6,400,172 B1 | 6/2002 | Akram et al. |
| 6,415,972 B1 | 7/2002 | Leap |
| 6,420,786 B1 | 7/2002 | Gonzalez et al. |
| 6,443,350 B2 | 9/2002 | Farnworth |
| 6,458,696 B1 | 10/2002 | Gross |
| 6,533,159 B1 | 3/2003 | Cobbley et al. |
| 6,570,251 B1 | 5/2003 | Akram et al. |
| 6,577,004 B1 | 6/2003 | Rumsey et al. |
| 6,586,043 B1 | 7/2003 | Sinha |
| 6,588,645 B2 | 7/2003 | Farnworth |
| 6,589,594 B1 | 7/2003 | Hembree |
| 6,592,943 B2 * | 7/2003 | Chan et al. ................ 427/282 |
| 6,595,408 B1 | 7/2003 | Cobbley et al. |
| 6,667,551 B2 | 12/2003 | Hanaoka et al. |
| 6,726,083 B2 | 4/2004 | Leap |
| 6,762,503 B2 | 7/2004 | Lee |
| 6,800,930 B2 | 10/2004 | Jackson et al. |
| 6,814,778 B1 | 11/2004 | Farnworth |
| 6,833,623 B2 | 12/2004 | Leiphart |
| 6,850,084 B2 | 2/2005 | Hembree |
| 6,852,627 B2 | 2/2005 | Sinha et al. |
| 6,855,631 B2 | 2/2005 | Kirby |
| 6,885,613 B1 | 4/2005 | Bainbridge et al. |
| 6,906,417 B2 | 6/2005 | Jiang et al. |
| 6,908,856 B2 | 6/2005 | Beyne et al. |
| 6,914,326 B2 | 7/2005 | Rumsey et al. |
| 6,940,179 B2 | 9/2005 | Lee |
| 6,943,106 B1 | 9/2005 | Kirby et al. |
| 6,957,760 B2 | 10/2005 | Cobbley et al. |
| 6,960,373 B2 | 11/2005 | Farnworth |
| 6,962,867 B2 | 11/2005 | Jackson et al. |
| 6,974,071 B2 | 12/2005 | Buley et al. |
| 6,984,583 B2 | 1/2006 | Farnworth |
| 6,998,344 B2 | 2/2006 | Akram et al. |
| 6,998,345 B2 | 2/2006 | Kirby |
| 7,022,579 B2 | 4/2006 | Li et al. |
| 7,029,949 B2 | 4/2006 | Farnworth et al. |
| 2003/0215568 A1 | 11/2003 | Hembree |
| 2004/0201095 A1 | 10/2004 | Palmer et al. |
| 2005/0064707 A1 | 3/2005 | Sinha |
| 2005/0077630 A1 | 4/2005 | Kirby et al. |
| 2005/0106834 A1 | 5/2005 | Andry et al. |
| 2005/0186791 A1 | 8/2005 | Hiatt |
| 2005/0200028 A1 | 9/2005 | Farnworth et al. |
| 2006/0027934 A1 | 2/2006 | Edelstein et al. |
| 2006/0037864 A1 | 2/2006 | Hiatt |
| 2006/0040494 A1 | 2/2006 | Hiatt |
| 2006/0043598 A1 | 3/2006 | Kirby et al. |
| 2006/0046468 A1 | 3/2006 | Akram et al. |
| 2006/0046471 A1 | 3/2006 | Kirby et al. |
| 2006/0099727 A1 * | 5/2006 | Konrad et al. ................ 438/14 |
| 2006/0115932 A1 | 6/2006 | Farnworth et al. |
| 2007/0246819 A1 * | 10/2007 | Hembree et al. ............ 257/698 |

FOREIGN PATENT DOCUMENTS

| | | |
|---|---|---|
| WO | WO 03/019651 A2 | 3/2003 |
| WO | WO 2006/023318 A1 | 3/2006 |

OTHER PUBLICATIONS

A.C.E. Production Technologies, Model KISS-101 and KISS-102, "Keep It Simple Soldering," Affordable Selective Soldering Machine, http:/www.ace-protech.com, 13 pages (no date).

* cited by examiner

METHODS FOR SELECTIVELY FILLING APERTURES IN A SUBSTRATE TO FORM CONDUCTIVE VIAS WITH A LIQUID USING A VACUUM

CROSS-REFERENCE TO RELATED APPLICATION

The subject matter of U.S. patent application Ser. No. 11/446,003, filed Jun. 1, 2006, pending, is incorporated into the present application in its entirety by this reference and is related to the subject matter of the present application.

BACKGROUND OF THE INVENTION

1. Field of the Invention

Embodiments of the present invention relate generally to methods and systems for forming conductive vias in a substrate, such as, for example, a semiconductor die, a full or partial semiconductor wafer, or a printed circuit board.

2. Background of Related Art

Circuit boards (often referred to as "printed circuit boards," "wiring boards," or "printed wiring boards") are used in electronic devices to mechanically hold and to provide electrical communication between the electrical components thereof. Electrical components such as transistors, resistors, capacitors, and semiconductor devices (e.g., electronic signal processors and memory devices) may be soldered into a circuit board and electrically interconnected by electrically conductive signal traces formed within or on the surfaces of the circuit board.

Semiconductor dies, semiconductor die packages, and semiconductor device modules may be provided that include a number of electrically conductive elements, which may be structurally and electrically coupled to corresponding conductive elements formed on a substrate such as a printed circuit board. Such dies, packages, and modules may include, by way of example only, microprocessors, dynamic random access memory (DRAMs), static random access memory (SRAMs), non-volatile memory such as flash memory, and application specific integrated circuits (ASICs), and may each have hundreds or thousands of electrically conductive elements requiring electrical interconnection with the conductive elements of a circuit board. The electrically conductive traces in the circuit board are used to interconnect the semiconductor devices and the other electrical components.

To provide electrical communication between various devices and components in a microelectronic device or system, it may be necessary to provide electrical communication through a substrate (such as, for example, a semiconductor die, or a full or partial semiconductor wafer, a semiconductor device package, or a printed circuit board) between conductive elements that are disposed in different planes. Electrically conductive vias are used, conventionally, to establish such electrical communication. An electrically conductive via typically includes a hole at least partially penetrating the substrate that is at least partially filled or lined with conductive material.

Various methods for forming conductive vias in substrates have been proposed in the art. Generally, an aperture (commonly known as a "via hole") is formed at least partially through the substrate, typically in a direction generally perpendicular to a plane in which a surface of the substrate is located. The aperture then is filled with conductive material, such as a metal, a metal alloy, doped polysilicon, or a conductive or conductor-filled resin, such as an epoxy, thereby forming a conductive via that provides a conductive path extending at least partially through the substrate.

In some cases, the aperture length is significantly greater than the diameter or lateral extent (if not circular) thereof. In such cases, the aperture is said to have a "high" aspect ratio. Filling an aperture having a relatively high aspect ratio with conductive material generally is more difficult than filling an aperture having a relatively low aspect ratio.

Where the substrate itself is electrically conductive or semiconductive, the walls of the substrate within the aperture must be electrically insulated prior to filling the aperture with conductive material to avoid short-circuiting. For example, a precursor aperture may be formed using, for example, a laser beam, an electron beam, an ion beam, or a very small drill bit or router bit. The precursor aperture is larger in diameter than the conductive via to be formed in the precursor aperture. After forming the precursor aperture, a thin layer of insulating material is formed or disposed on the surface of the substrate within the precursor aperture. In some instances, the precursor aperture then may be substantially filled with an electrically insulating polymer material, after which a subsequent, smaller aperture may be formed through the polymer material. In either case, the resulting, insulated aperture then may be filled with conductive material, as previously discussed.

To fill an aperture extending through a substrate with conductive solder material, the surfaces of the substrate adjacent and within the aperture generally are lined with a flux material, which may include an organic acid that prevents the formation of oxides and promotes wetting of the surfaces of the substrate by the solder material. Organic components of the flux material may volatilize upon heating of the substrate to generate gases, which may create voids within the conductive solder material or cause other defects in the substrate through which the conductive via extends.

BRIEF DESCRIPTION OF THE DRAWINGS

While the specification concludes with claims particularly pointing out and distinctly claiming that which is regarded as the present invention, the advantages of this invention can be more readily ascertained from the following description of various embodiments of the present invention when read in conjunction with the accompanying drawings in which:

DETAILED DESCRIPTION OF THE ILLUSTRATED EMBODIMENTS

Figure 1A:
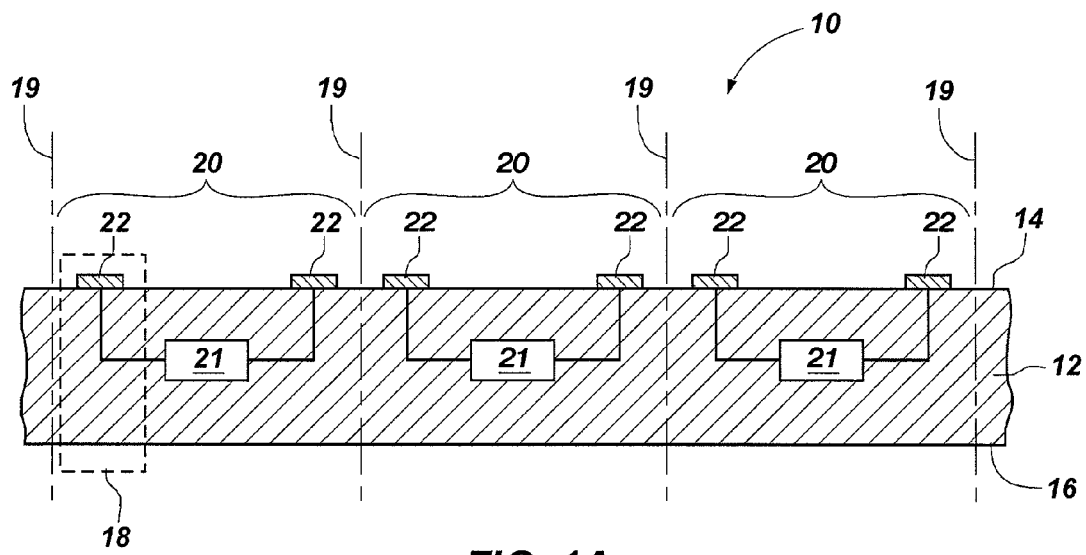
FIGS. 1A-1J are a series of side cross-sectional views illustrating various stages in one method of forming a conductive via through a substrate that embodies teachings of the present invention.

As discussed in further detail below, the present invention includes methods of forming one or more conductive vias in a substrate. In one example embodiment, a substrate that includes at least one aperture may be contacted with a wave of conductive, liquid material, such as a molten solder wave, and a vacuum may be provided within the aperture to draw molten solder material into the aperture from the molten solder wave as the mouth of the aperture is contacted by the solder wave. As used herein, the term "vacuum" merely indicates a reduced gas pressure relative to gas (such as ambient) pressure external to the aperture, and must not be construed as requiring an absolute or substantially absolute vacuum. Optionally, the molten solder wave may be formed by flowing molten solder material out from an outlet of a molten solder-dispensing device in a flow direction generally against a direction of a gravitational field, such that the gravitational field causes the flow direction of the molten solder material to change after the molten solder material flows out from the outlet of the solder-dispensing device. In addition, molten solder material optionally may be selectively drawn into one aperture of a plurality of apertures in the substrate without drawing molten solder material into other apertures in the substrate.

In another example embodiment, at least one via hole may be formed in a substrate from a first surface, and a vent hole may be formed that extends between a second surface of the substrate and the at least one via hole. A surface of the substrate may be contacted with a wave of conductive liquid material, and a vacuum may be provided within the via hole to draw the liquid material into the via hole from the wave. The liquid material may be solidified within the via hole to form an electrically conductive structure within the via hole. For example, the first surface of the substrate may be contacted with the wave of liquid material, and the vacuum may be provided adjacent the vent hole at the second surface of the substrate.

In yet another example embodiment, a plurality of apertures may be formed through a substrate from a first surface to a second surface. A plate member may be provided against the second surface of the substrate. The plate member may include a plurality of holes extending therethrough, each of which is aligned with an aperture of the substrate. A vacuum fixture may be abutted against the plate member on a side thereof opposite the substrate, the substrate may be contacted with molten solder material, and a vacuum may be provided within the vacuum fixture and at least one aperture of the substrate to draw molten solder material into the aperture.

In still another example embodiment, the present invention includes methods of forming conductive vias in a substrate that have various chemical compositions. Optionally, such conductive vias may be formed one at a time in a substrate. A plurality of apertures may be formed through a substrate from a first surface to a second surface. A vacuum may be provided within at least one of the apertures, and the substrate may be selectively contacted with a first molten solder material having a first composition to selectively draw the first molten solder material into the aperture. A vacuum may be provided within at least one other aperture, and the substrate may be selectively contacted with a second molten solder material having a second composition to selectively draw the second molten solder material into the other aperture.

As also discussed in detail below, the present invention further includes systems for forming conductive vias in a substrate. In one example embodiment, a system includes a substrate fixture for supporting a substrate, a vacuum device having a vacuum fixture for generating a vacuum within an aperture in a substrate supported by the substrate fixture, and a solder-dispensing device that is configured to provide a wave of molten solder material. The system may further include a lateral translation device that is configured to provide relative lateral movement between the wave of molten solder material and a substrate supported by the substrate fixture, and a vertical movement device configured to provide relative vertical movement between the wave of molten solder material and the substrate. A controller may be configured to selectively control at least the lateral translation device and the vertical movement device of the system. The wave of molten solder material provided by the solder-dispensing device may have a size and shape capable of filling one aperture of a substrate with solder material without filling other apertures of the substrate with solder material.

In another example embodiment, a system includes a vacuum device having a vacuum fixture for providing a vacuum within at least one aperture of a plurality of apertures extending through a semiconductor die or wafer, and a solder-dispensing device configured to fill one aperture of the plurality of apertures with molten solder material from a molten solder wave without filling other apertures of the plurality of apertures with the molten solder material. Optionally, the solder-dispensing device may be configured to provide at least one wave of solder material having a size and shape capable of filling at least one aperture with molten solder material without filling other apertures with molten solder material. In addition, the system may optionally include a plate member for placement between the vacuum fixture and the substrate.

In yet another example embodiment, the present invention includes plate members for use in selectively applying a vacuum within a plurality of apertures extending into a semiconductor die, a semiconductor wafer, or a partial semiconductor wafer from a surface thereof. The plate members may include a generally planar layer of material having a first major surface and a second major surface, and a plurality of apertures extending through the layer of material between the first major surface and the second major surface. The plurality of apertures may be disposed in a selected pattern in the generally planar layer of material that is substantially identical to a pattern of apertures extending through a semiconductor die, a semiconductor wafer, or a partial semiconductor wafer.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

As used herein, the term "substrate" includes any structure through which a conductive via may be formed. Substrates include, by way of nonlimiting examples, semiconductor dies, full and partial semiconductor wafers, semiconductor device packages, interposer substrates, and circuit boards.

A method for forming conductive vias in a substrate that embodies teachings of the present invention is described below with reference to FIGS. 1A-1J. FIG. 1A illustrates a portion of a workpiece 10 that includes a generally planar substrate 12 in which conductive vias are to be formed that extend at least partially between a first major surface 14 of the substrate 12 and an opposing second major surface 16 of the substrate 12. As shown in FIG. 1A, the workpiece 10 may comprise a full or partial semiconductor wafer in which a plurality of individual integrated circuits 21 have been formed or are to be formed. The integrated circuits 21 are represented schematically in FIG. 1A by rectangular boxes. A plurality of electrically conductive terminals 22 (e.g., bond pads) that are operatively coupled to the integrated circuits 21 may be provided on or in one or both of the first surface 14 and the second surface 16 of the substrate 12. At a subsequent manufacturing stage, discrete semiconductor dies 20 may be singulated from the semiconductor wafer by sawing or otherwise cutting the wafer between the individual integrated circuits 21 (e.g., along the broken lines 19).

Figure 1B:
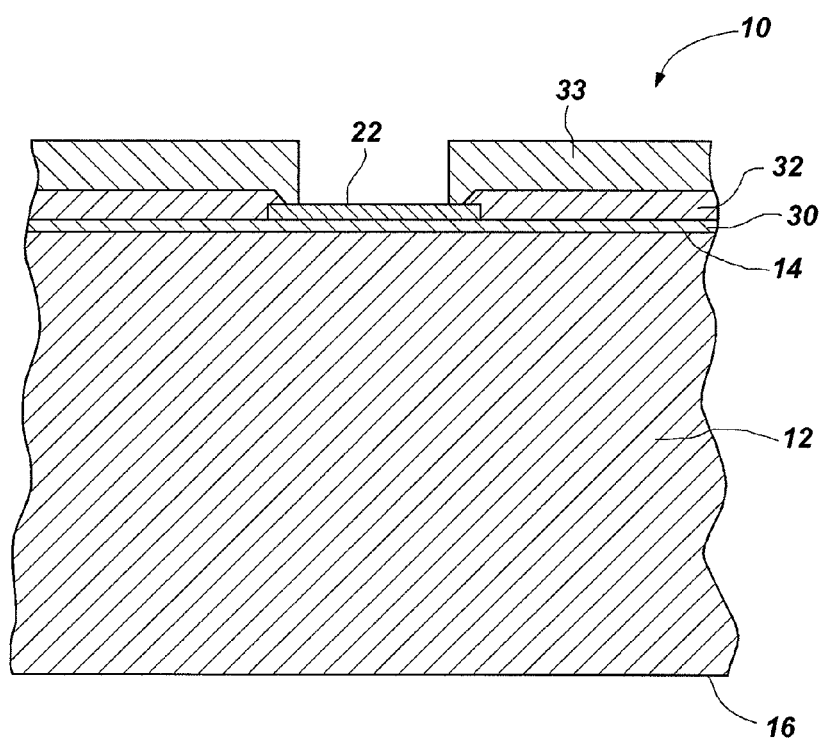

FIG. 1B is an enlarged, side cross-sectional view of the area 1B shown in FIG. 1A. In previous processing steps, a first dielectric layer 30 optionally may be applied to the first surface 14 of the substrate 12, and a second dielectric layer 32 optionally may be applied over the first dielectric layer 30. The second dielectric layer 32 may be patterned and etched to expose the conductive terminal 22. The dielectric layers 30 and 32 each may include, for example, parylene, tetraethylorthosilicate (TEOS), silicon nitride ($Si_3N_4$), silica ($SiO_2$), or electrically insulating polymer material (such as, for example, a polyimide-based material) and/or any other suitable materials. The first dielectric layer 30 may have a different composition from the second dielectric layer 32. In additional embodiments, the first dielectric layer 30 may have a composition that is substantially identical to the composition of the second dielectric layer 32. It is contemplated that one or both of the dielectric layers 30 and 32 may be omitted and/or additional layers may be included. After depositing the second dielectric layer 32, a mask 33 may be applied over the second dielectric layer 32 and patterned as shown in FIG. 1B. The mask 33 may include a layer of resist, which may be patterned to expose at least a portion of each of the conductive terminals 22 through the mask 33.

Figure 1C:
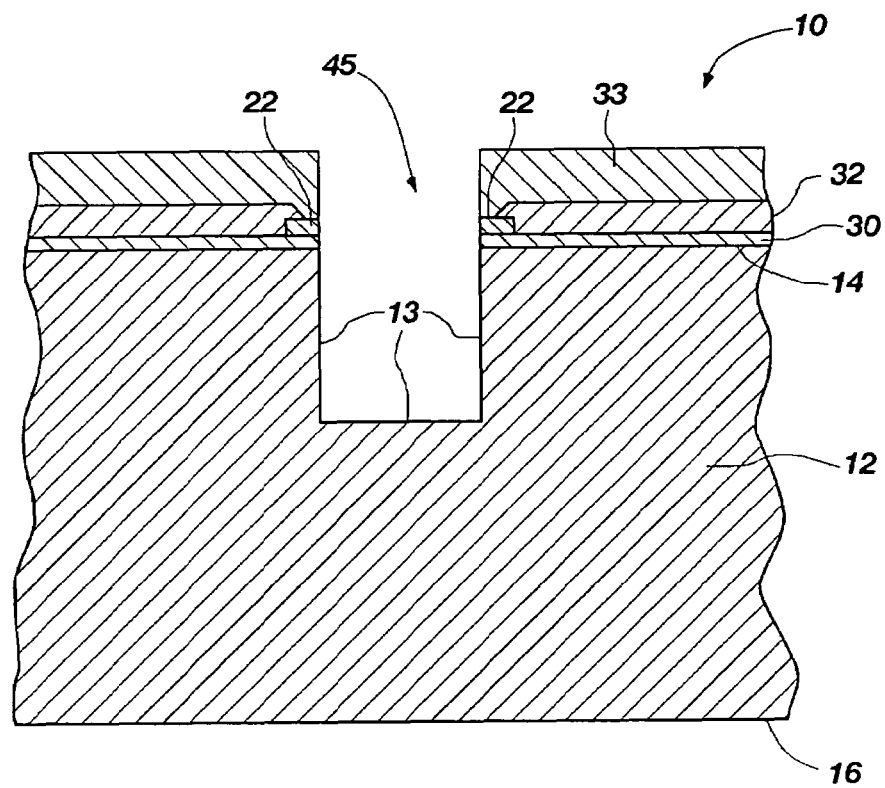

Referring to FIG. 1C, a via hole 45 may be formed through at least part of the substrate 12. As shown in FIG. 1C, the via hole 45 may extend only partially through the substrate 12 between the first surface 14 and the second surface 16. In such a configuration, the via hole 45 may be characterized as a "blind via hole." As used herein, the term "blind via hole" means a hole or aperture that extends only partially through the substrate 12 or is otherwise closed at one end.

If the workpiece 10 includes conductive terminals 22, the via hole 45 may extend through the conductive terminal 22, as well as through other features or structures on the substrate 12, such as, for example, the first dielectric layer 30. In one embodiment, the via hole 45 can be formed by etching through the materials using one or more etching processes (e.g., a wet chemical etch or a dry plasma etch). After forming the via hole 45, the mask 33 may be removed from the workpiece 10.

In additional embodiments, the via hole 45 may be formed using a laser ablation process (i.e., laser drilling). If a laser ablation process is used to form all or a portion of the via hole 45, the workpiece 10 may be cleaned as necessary after the laser ablation process using cleaning agents to remove slag or other contaminants generated by the laser ablation process, as well as damaged substrate material, for example damaged silicon in the so-called "heat affected zone" if substrate 12 comprises a semiconductor wafer.

After forming the via hole 45 in the substrate 12, one or more layers of material optionally may be deposited over one or more surfaces 13 of the substrate 12 within the via hole 45, as described in further detail below.

Figure 1D:
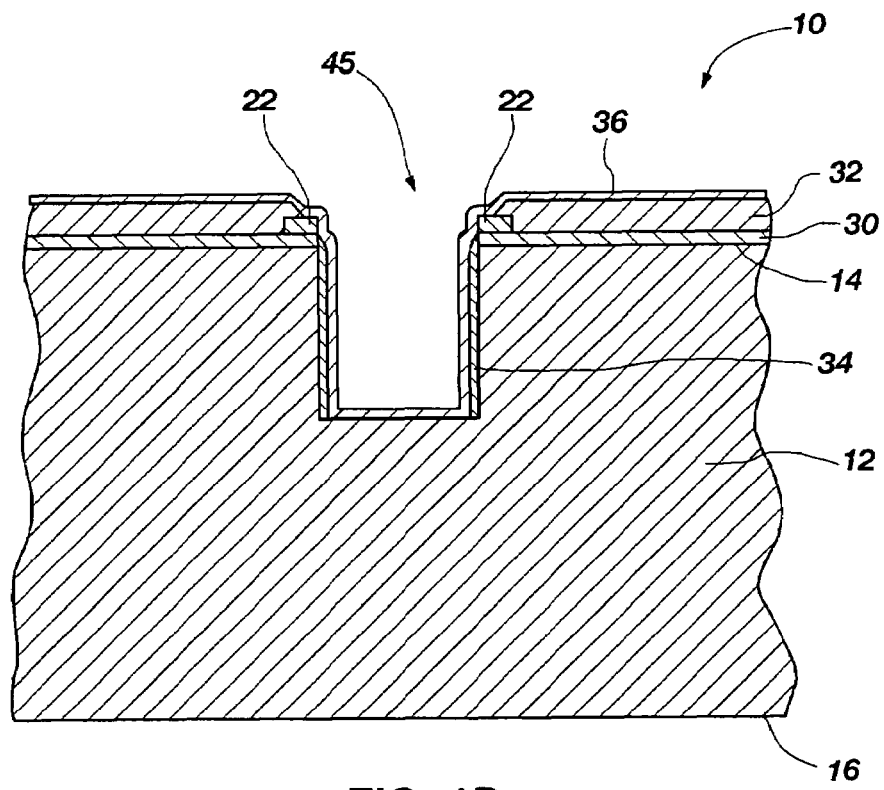

Referring to FIG. 1D, a third dielectric layer 34 may be deposited over one or more interior surfaces 13 of the substrate 12 within the via hole 45. The third dielectric layer 34 may include, for example, one or more of the electrically insulating materials previously described in relation to the dielectric layers 30 and 32. The third dielectric layer 34 may be removed from at least a portion of each conductive terminal 22 using, for example, a suitable etching process. If such an etching process includes a directional etching process, portions of the third dielectric layer 34 at the bottom of the via hole 45 may be etched thinner or etched entirely away during the directional etching process. In additional embodiments, the third dielectric layer 34 may be prevented from covering at least a portion of each conductive terminal 22 as the third dielectric layer 34 is formed. A layer of barrier material 36 may be deposited over the third dielectric layer 34 within the via hole 45. As used herein, the term "barrier material" means any material selected to prevent the migration of matter (e.g., atoms, molecules, etc.) through the material. By way of example and not limitation, the barrier material may be selected to prevent the migration of copper atoms through the layer of barrier material 36 and may include, for example, tantalum, a tantalum alloy, tungsten, a tungsten alloy, or other suitable barrier materials. The layer of barrier material 36 may be electrically conductive and may be provided in electrical contact with the conductive terminal 22. In some embodiments, the layer of barrier material 36 may at least initially cover the second dielectric layer 32 and the conductive terminal 22 in addition to the third dielectric layer 34. The layer of barrier material 36 may be deposited onto the workpiece 10 using, for example, a vapor deposition process, such as a chemical vapor deposition (CVD) process or a physical vapor deposition (PVD) process. In some embodiments, the layer of barrier material 36 may have a thickness of between about 10 angstroms and about 500 angstroms.

Figure 1E:
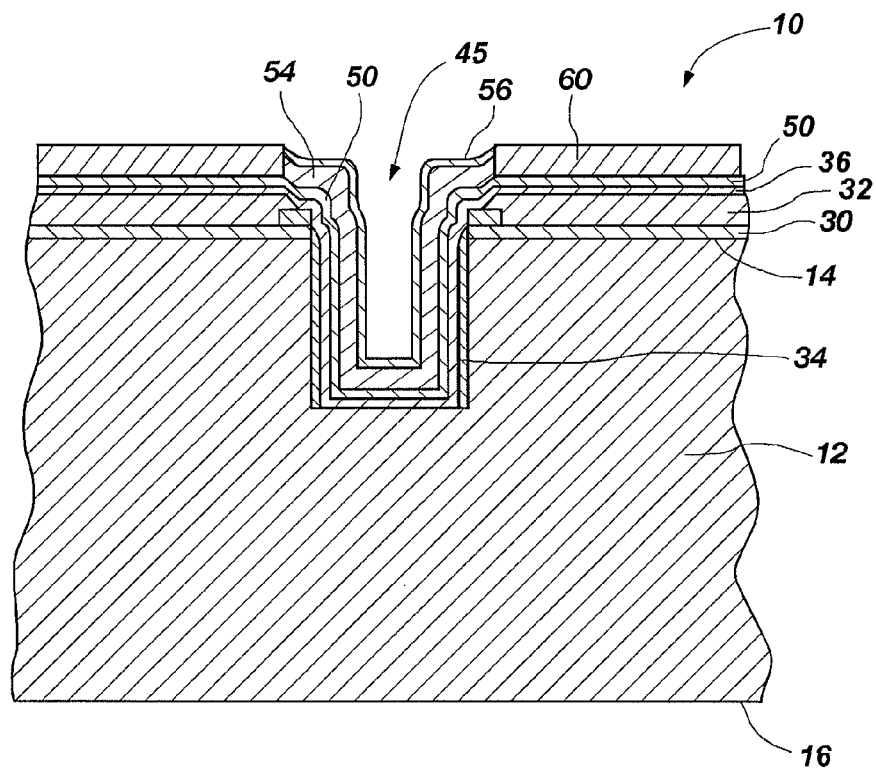

Referring to FIG. 1E, a layer of solder-wettable material 54 also may be provided over surfaces 13 of the substrate 12 within the via hole 45. By way of example and not limitation, the solder-wettable material 54 may include, for example, nickel, palladium, gold, or any other metals, metal alloys, or materials that are wettable relative to a solder material to be subsequently provided within the via hole 45, as discussed in further detail below.

In some embodiments, the solder-wettable material 54 may not adhere well to the layer of barrier material 36. As a result, it may be necessary or desirable to provide a layer of adhesion material 50 between the layer of solder-wettable material 54 and the layer of barrier material 36 to facilitate adhesion of the layer of solder-wettable material 54 to the layer of barrier material 36. As used herein, the term "adhesion material" means any material selected to facilitate adhesion of a first material immediately adjacent a first surface of the material to a second material immediately adjacent another surface of the material. For example, a layer of copper may be used as a layer of adhesion material 50 to facilitate adhesion of a layer of nickel (a layer of solder-wettable material 54) to a layer of tantalum (a layer of barrier material 36). By way of example and not limitation, the layer of adhesion material 50 may be deposited using vapor deposition techniques, such as chemical vapor deposition (CVD), physical vapor deposition (PVD), or atomic layer deposition. In some embodiments, the layer of adhesion material 50 may have a thickness of between about 400 angstroms and about 4,000 angstroms.

In some embodiments of the present invention, the layer of solder-wettable material 54 may have a thickness that is relatively large compared to the thickness of each of the layer of barrier material 36 and the layer of adhesion material 50. In some embodiments, the layer of solder-wettable material 54 may have a thickness of between about 10,000 angstroms and about 50,000 angstroms.

It may be necessary or desirable to remove portions of these layers remote from the via hole 45 during subsequent manufacturing processes, and as a result, it may be necessary or desirable to selectively form the layer of solder-wettable material 54 over the layer of adhesion material 50 only at locations within and proximate to the via hole 45. As shown in FIG. 1E, a resist layer 60 may be deposited over the layer of adhesion material 50, and the resist layer 60 may be selectively patterned to expose the underlying layer of adhesion material 50 within and proximate to the via hole 45. The layer of solder-wettable material 54 then may be provided over the exposed regions of the layer of adhesion material 50 within and proximate the via hole 45. As previously discussed, the layer of solder-wettable material 54 may act as a wetting or wicking agent that promotes filling of the via hole 45 with conductive solder material, as discussed in further detail below. The layer of solder-wettable material 54 may include, for example, nickel, and may be deposited over the underlying layer of adhesion material 50 using an electroless or electrolytic plating process.

In some embodiments, a relatively thin layer of material 56 comprising a noble metal (such as, for example, palladium and/or gold) may be provided over layer of solder-wettable material 54, as shown in FIG. 1E. The noble metal may prevent oxidation of the layer of solder-wettable material 54. In some embodiments, the layer of material 56 comprising a noble metal may have a thickness of between about 500 angstroms and about 1,500 angstroms.

In one particular embodiment, set forth merely as an example, the third dielectric layer 34 may comprise a layer of silica ($SiO_2$) having an average thickness of about 10,000 angstroms, the layer of barrier material 36 may comprise a layer of tantalum having an average thickness of about 150 angstroms, the layer of adhesion material 50 may comprise a layer of copper having an average thickness of about 2,000 angstroms, the layer of solder-wettable material 54 may comprise a layer of nickel having an average thickness of about 30,000 angstroms, and the layer of material 56 comprising a noble metal may comprise a layer of palladium having an average thickness of about 1,000 angstroms.

It is contemplated that in additional embodiments of the present invention, any or all of the foregoing layers of material deposited over the surfaces 13 (FIG. 1C) of the substrate 12 within the via hole 45 may be omitted, with the exception of a dielectric layer covering the surfaces 13 of via hole 45 if substrate 12 is conductive or semiconductive and shorting is to be avoided. Furthermore, in additional embodiments of the present invention, any of the foregoing layers of material deposited over the surfaces 13 (FIG. 1C) of the substrate 12 within the via hole 45 may have compositions other than those set forth above as examples, and additional layers of material may also be included as necessary or desired.

Figure 1F:
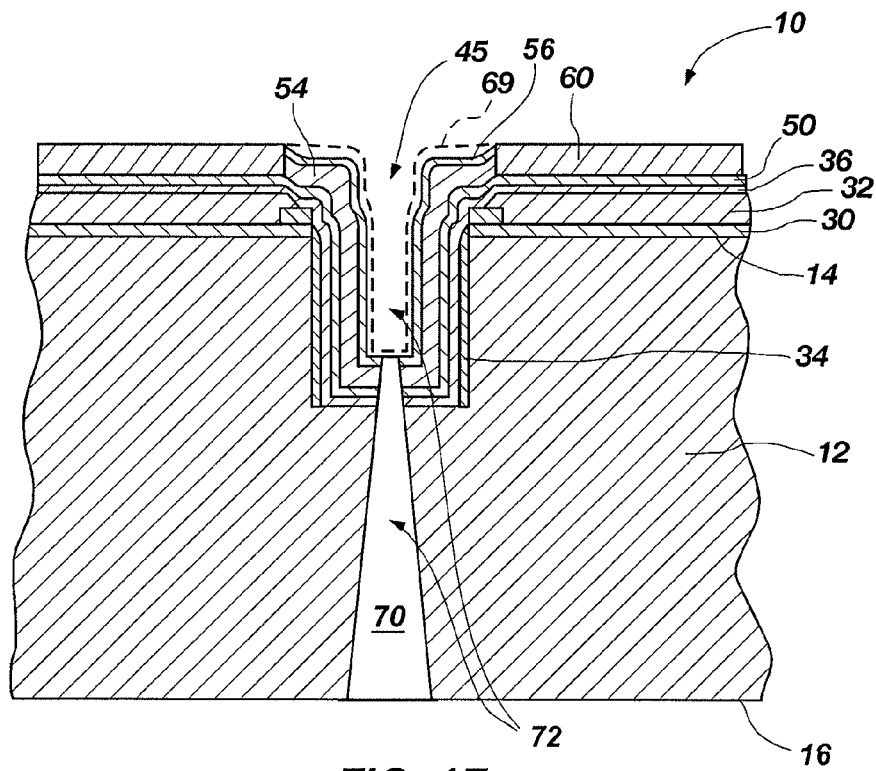

Referring next to FIG. 1F, a vent hole 70 may be formed through the substrate 12 that extends between the second surface 16 of the substrate and the via hole 45. In some embodiments, the vent hole 70 may be formed through the substrate 12 to the relatively thin layer of material 56 comprising a noble metal. In additional embodiments, the vent hole 70 may be formed entirely through the substrate 12 and the layer of material 56 to communicate with the via hole 45. The vent hole 70 and the via hole 45 together define an aperture 72 that extends through the substrate 12 between the first surface 14 and the second surface 16. The vent hole 70 may be formed using a laser ablation process, in which a laser may be used to drill through the substrate 12 from the second surface 16 to the bottom of the via hole 45. Laser drilling systems suitable for drilling through substrates 12, such as those described herein, are known to those of ordinary skill in the art and are commercially available. The laser may be aligned with the via hole 45 and/or the corresponding conductive terminal 22 (FIG. 1A) using scanning alignment systems that are also known in the art.

Optionally, a temporary protective filling or coating 69 (shown in broken lines in FIG. 1F) may be deposited over exposed surfaces within the via hole 45 prior to forming the vent hole 70. The protective coating 69 may include a photoresist material, a polymer material, water, solidified liquid or gas, and/or other suitable materials known in the art. The protective coating 69 may be used to protect the structures and exposed surfaces of the workpiece 10 within the via hole 45 from slag or other undesirable byproduct materials produced during the laser ablation process. The protective coating 69 can be removed after forming the vent hole 70.

The vent hole 70 is illustrated in FIG. 1F as having a funnel or frustoconical shape. The use of a laser ablation process to form the vent hole 70 may cause the vent hole 70 to have such a funnel or frustoconical shape. In additional embodiments, the vent hole 70 may have a different shape. For example, the vent hole 70 may be generally cylindrical. Furthermore, the vent hole 70 may be formed using methods other than laser ablation methods, such as, for example, etching processes (e.g., dry plasma etching processes and wet chemical etching processes), mechanical drilling processes, or any other suitable processes known in the art.

In additional embodiments, any or all of the various layers of material deposited over surfaces 13 of the substrate 12 within the via hole 45 may be formed subsequent to forming the vent hole 70 through the substrate 12 instead of prior to forming the vent hole 70, as previously described.

It is contemplated that, in additional embodiments, the aperture 72 extending through the substrate 12, which, as described above, includes the via hole 45 and the vent hole 70, may include a single hole or aperture extending through the substrate 12 between the first surface 14 and the second surface 16, and that such a single hole or aperture may be formed in a single process (such as, for example, a laser ablation process, an etching process, or a mechanical drilling process).

After forming the aperture 72, the via hole 45 may be filled with a conductive solder material, as described below.

Figure 1G:
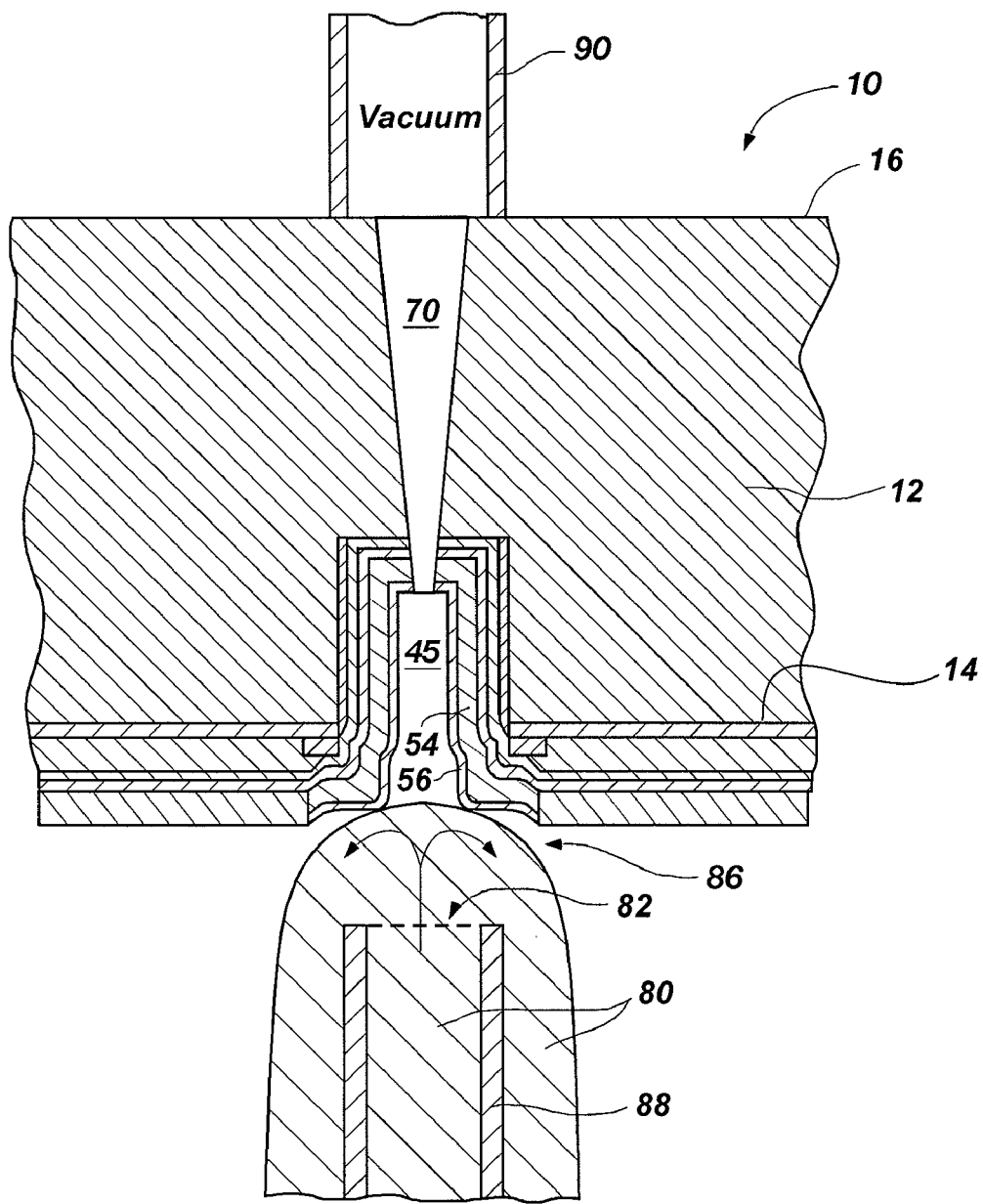

FIG. 1G is a side cross-sectional view like that of FIG. 1F illustrating a portion of the workpiece 10 that includes a via hole 45 and a vent hole 70 communicating therewith. The workpiece 10 is illustrated as being inverted relative to the orientation shown in FIGS. 1A-1F. To form a conductive via in the substrate 12, molten solder material 80 may be caused to flow out from an outlet 82 of a nozzle 88 of a molten solder-dispensing device, as shown in FIG. 1G. The outlet 82 of the nozzle 88 of the molten solder-dispensing device may be oriented such that the molten solder material 80 flows out from the outlet 82 in a flow direction that is generally against the gravitational field (i.e., generally gravitationally upward). In such a configuration, the gravitational field will cause the flow direction of the molten solder material 80 to change after the molten solder material 80 flows out from the outlet 82 of the nozzle 88. In other words, the molten solder material 80 will begin to fall gravitationally downward after exiting the outlet 82 of the nozzle 88. A molten solder wave 86 is formed by the molten solder material 80 as the molten solder material 80 changes flow direction in response to the gravitational field. The molten solder material 80 may have any composition, and may include, for example, cobalt, copper, gold, lead, nickel, silver, tin, alloys or mixtures of such metals, and/or other conductive materials known in the art and, accordingly, the term "solder" is used in a nonlimiting sense, denoting only a conductive material that may be placed in a liquid state for use as set forth herein.

A vacuum fixture 90, shown herein as a quill, may be provided adjacent the vent hole 70 at the second surface 16 of the substrate 12. In some embodiments, the vacuum fixture 90 may be sealably positioned against the second surface 16 of the substrate 12 proximate the vent hole 70. For example, the vacuum fixture 90 may be abutted against the second surface 16 of the substrate 12 and the distal end of the vacuum fixture 90 at the mouth thereof may be provided with an elastomeric or other resilient material to enhance sealing against the second surface of the substrate 12.

Figure 1H:
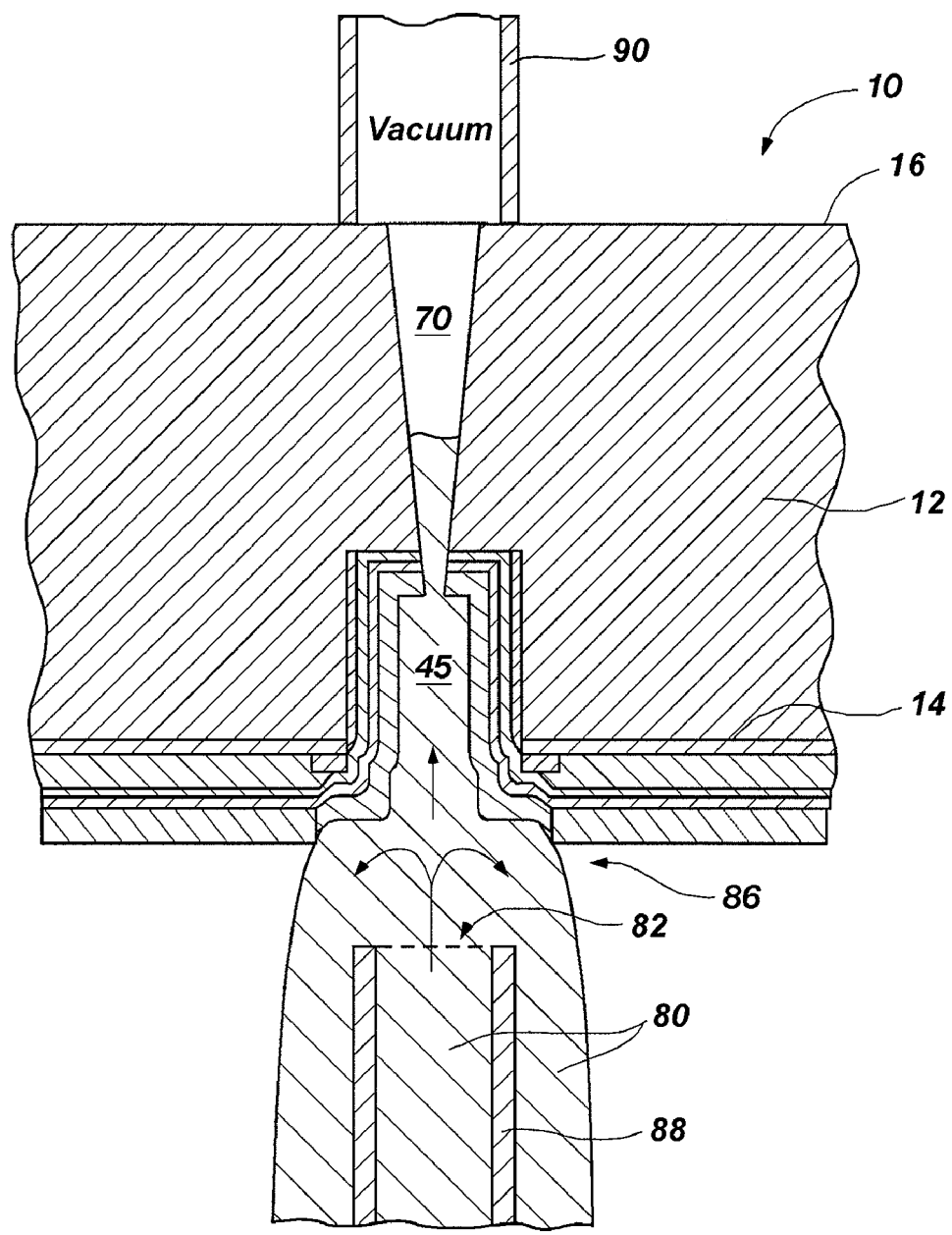

Referring to FIG. 1H, the workpiece 10 may be selectively contacted with the molten solder wave 86, and the vacuum fixture 90 may be used to provide a vacuum within the vacuum fixture 90, the vent hole 70, and the via hole 45 to draw molten solder material 80 at least into the via hole 45. As the molten solder material 80 fills the via hole 45, the thin layer of material 56 (FIG. 1G) comprising a noble metal may substantially melt and dissolve in the molten solder material 80 to expose the underlying layer of solder-wettable material 54. In some embodiments, the molten solder material 80 may substantially entirely fill the via hole 45 and partially fill the vent hole 70. In other embodiments, the molten solder material 80 may substantially entirely fill both the via hole 45 and the vent hole 70. In yet additional embodiments, the molten solder material 80 may substantially entirely fill the via hole 45 without penetrating into the vent hole 70.

In some methods, at least a portion of the workpiece 10 may be heated prior to filling the via hole 45 and vent hole 70 with the molten solder material 80, which may facilitate entry of the molten solder material 80 into the aperture 72 (which comprises the via hole 45 and the vent hole 70 as shown in FIG. 1F) to a desired extent without premature cooling and solidification thereof.

After the molten solder material 80 has penetrated into the via hole 45 (and optionally the vent hole 70) to a desired extent, contact between the molten solder wave 86 and the via hole 45 of the workpiece 10 may be interrupted. As the workpiece 10 and the molten solder material 80 within the via hole 45 (and optionally the vent hole 70) is allowed to cool, the molten solder material 80 may solidify to form a conductive via 96, as shown in FIG. 1I.

Figure 1I:
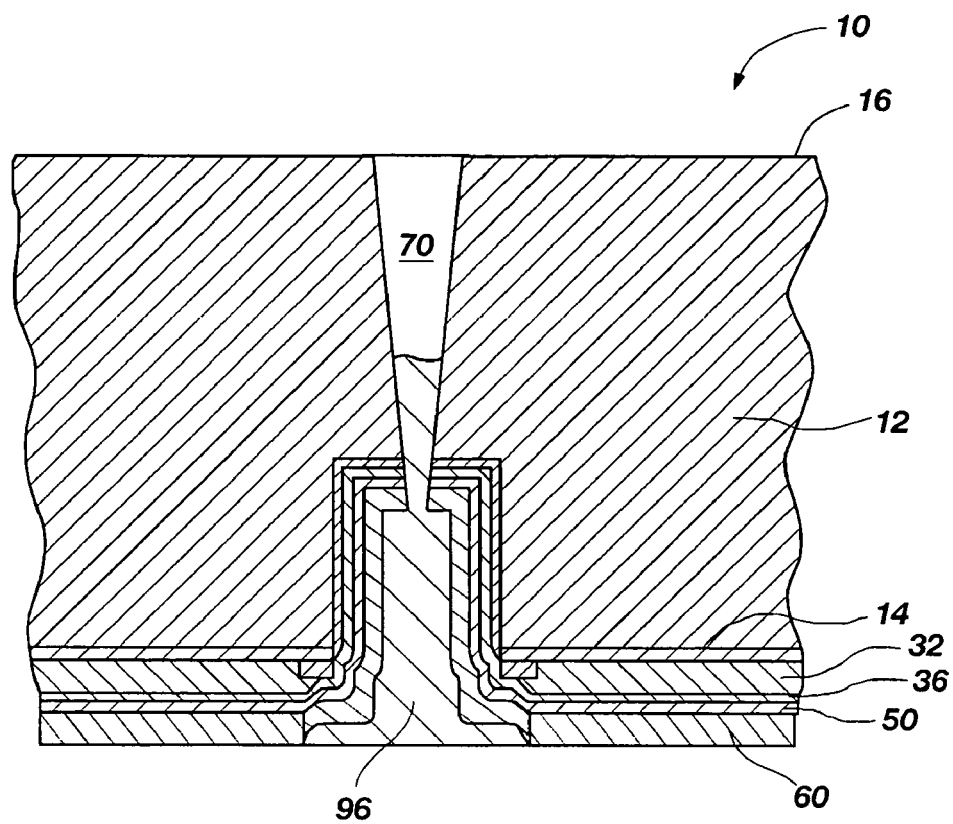
Figure 1J:
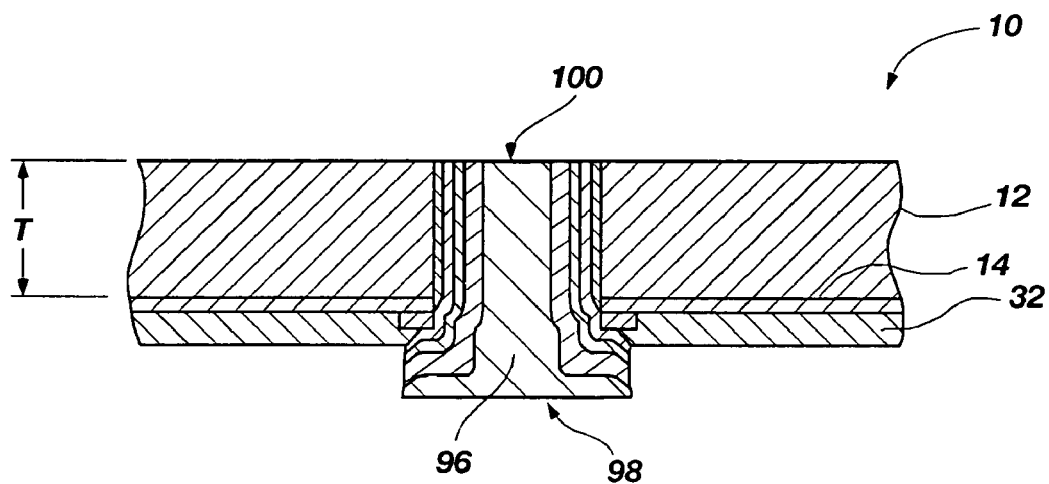

Referring to FIGS. 1I and 1J together, in some embodiments, the resist layer 60 may be removed from the workpiece 10, and a suitable etching process may be used to remove the portions of the layer of adhesion material 50 and the layer of barrier material 36 that are exposed after removing the resist layer 60. In addition, the substrate 12 may be thinned to a desired thickness T, shown in FIG. 1J, by removing material from the second side 16 of the substrate 12 using, for example, a grinding process, an etching process, a chemical polishing process, or a chemical mechanical planarization (CMP) process. Thinning the substrate 12 may provide a first exposed end 98 of the conductive via 96 on one side of the workpiece 10 and a second exposed end 100 of the conductive via 96 on an opposite side of the workpiece 10. In one embodiment, the initial thickness of the substrate 12 (as shown in FIGS. 1A-1I) may be about 750 microns, and the final thickness T may be between about 100 microns and about 500 microns. In other embodiments, the initial and final thicknesses of the substrate 12 may have other values depending on various factors including the type of workpiece, application, etc.

As previously discussed, the workpiece 10 may include a plurality of via holes 45 in which it is desired to form conductive vias, such as the conductive via 96. In some embodiments of the present invention, the outlet 82 of the nozzle 88 of the solder-dispensing device may have a size and shape selectively configured to provide a molten solder wave 86 that allows the molten solder wave 86 to selectively apply molten solder material 80 to a single via hole 45 without applying molten solder material 80 to other via holes 45. In other words, the molten solder wave 86 produced by the outlet 82 may have a size and shape that allows the molten solder wave 86 to fill a single via hole 45 with molten solder material 80 without filling other via holes 45 with molten solder material 80.

By way of example and not limitation, the outlet 82 of the nozzle 88 of the solder-dispensing device may have a generally circular cross-sectional shape and an average inner diameter of less than the sum of an average diameter of each via hole 45 and a shortest lateral separation distance between adjacent via holes 45 (edge-to-edge) in the substrate 12 of the workpiece 10. Similarly, the vacuum fixture 90 may have a generally circular cross-sectional shape and an average inner diameter at the mouth thereof of less than the sum of an average diameter of each via hole 45 and a shortest separation between adjacent via holes 45 (edge-to-edge) in the substrate 12 of the workpiece 10. In such a configuration, the outlet 82 of the nozzle 88 and the vacuum fixture 90 may be used, in combination, to form a conductive via in a single via hole 45 without forming a conductive via in other via holes 45 of the substrate 12.

In one embodiment, set forth merely as an example, each via hole 45 may have an average diameter of about 30 microns, and the shortest lateral separation distance between adjacent via holes 45 (edge-to-edge) in the substrate 12 of the workpiece 10 may be about 50 microns. In such a configuration, the outlet 82 of the nozzle 88 of the solder-dispensing device may have a generally circular cross-sectional shape and an average inner diameter at the mouth thereof of about 40 microns (less than 80 microns, which is the sum of 30 microns and 50 microns). Furthermore, the pressure within the outlet 82 of the nozzle 88 may be selected such that the molten solder wave 86 has a generally circular cross-sectional shape and an average outer diameter of about 60 microns. Similarly, the vacuum fixture 90 may have a generally circular cross-sectional shape and an average inner diameter of about 60 microns.

The outlet 82 of the nozzle 88 may include any material having a melting point that is higher than the melting point of the solder material 80, and that can be formed or processed to provide the relatively small outlet 82 of the nozzle 88. By way of example and not limitation, the outlet 82 of the nozzle 88 may include a metal or metal alloy, or a ceramic material such as, for example, alumina or silica. In some embodiments, the outlet 82 of the nozzle 88 may have a configuration that is structurally similar to a wire-bonding capillary as used in conventional wire-bonding machines known in the art. Many wire-bonding capillary designs are known in the art, and may be used as, or adapted for use as, an outlet 82 as described herein. By way of example and not limitation, the vacuum fixture 90 may be formed of a metal or metal alloy, a ceramic material, or a generally rigid polymer material. In some embodiments, the vacuum fixture 90 may be substantially identical to the outlet 82 of the nozzle 88, and also may have a configuration that is structurally similar to a wire-bonding capillary.

Methods for forming conductive vias 96 in a substrate 12 that embody teachings of the present invention, such as those described above with reference to FIGS. 1A-1J, may be carried out using systems that also embody teachings of the present invention.

Figure 2:
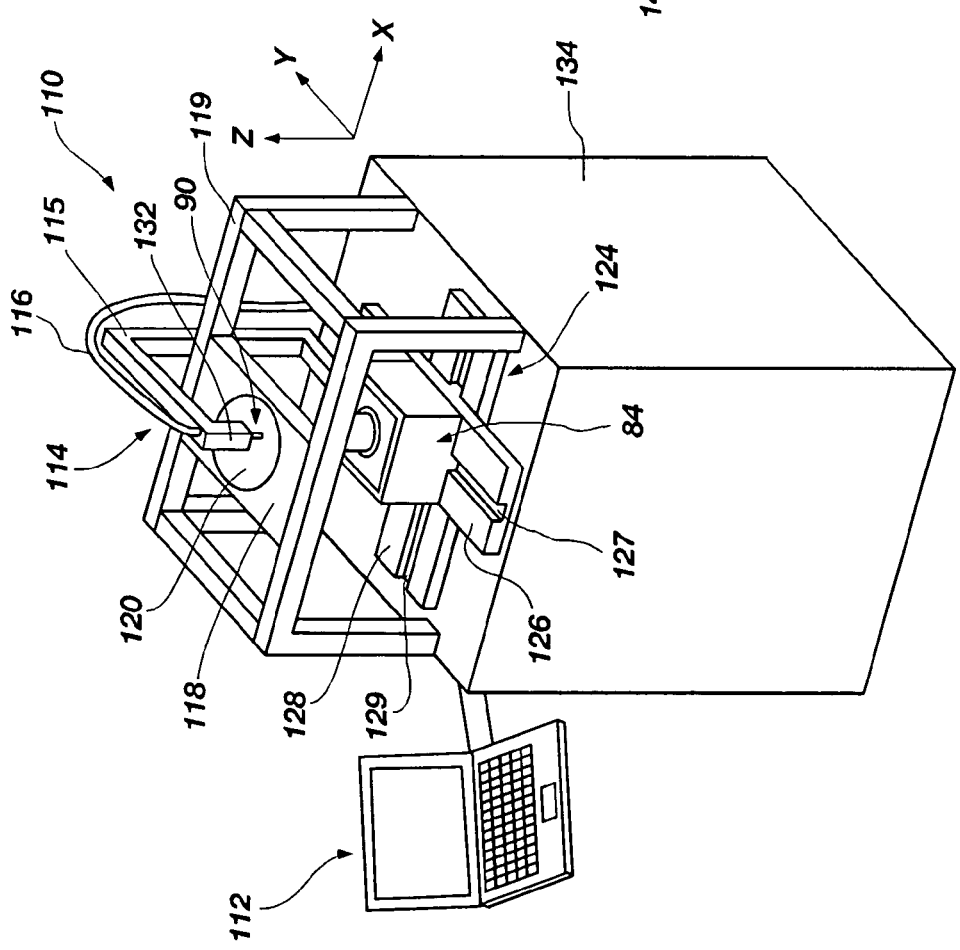
FIG. 2 is an example of a system that embodies teachings of the present invention and that can be used to form conductive vias in a substrate.

FIG. 2 is a perspective view of a solder system 110 that embodies teachings of the present invention and that may be used to form conductive vias in a substrate. The solder system 110 includes a solder-dispensing device 84 and a vacuum device 114. The solder system 110 may further include a substrate fixture 118 for holding a workpiece or substrate 120 (such as, for example, the previously described workpiece 10). In some embodiments of the present invention, each of the solder-dispensing device 84 and the vacuum device 114 may be configured to move in each of the X, Y, and Z directions relative to the substrate 120.

As shown in FIG. 2, the solder-dispensing device 84 may be mounted on a lateral translation device 124 that is configured to provide relative lateral movement between the substrate 120 and a molten solder wave provided by the solder-dispensing device 84. The lateral translation device 124 may include a commercially available XY translational stage that is configured to selectively move the solder-dispensing device 84 relative to the substrate 120 in each of the lateral X and Y directions. By way of example and not limitation, the lateral translation device 124 may include a first support plate 126 on which the solder-dispensing device 84 is mounted. The first support plate 126 may have a track or groove 127 that extends in a first direction (e.g., the Y direction) and interacts with corresponding structural features of the solder-dispensing device 84 such that the solder-dispensing device 84 is capable of sliding or otherwise moving back and forth along the first support plate 126 in the first direction. The lateral translation device 124 also may include a second support plate 128 on which the first support plate 126 is mounted. The second support plate 128 also may have a track or groove 129 that extends in a second direction that is generally perpendicular to the first direction in which the groove 127 of the first support plate 126 extends. The track or groove 129 may interact with corresponding structural features on the first support plate 126 such that the first support plate 126 is capable of sliding or otherwise moving back and forth along the second support plate 128 in the second direction (e.g., the X direction). Commercially available piezoelectric stepper motors (or any other motors or devices that may be used to precisely, selectively move components of an XY translational stage) may be used to selectively move the solder-dispensing device 84 back and forth relative to the first support plate 126, and to move the first support plate 126 back and forth relative to the second support plate 128.

With continued reference to FIG. 2, the vacuum device 114 may include a structural support member 115 and a generally flexible vacuum hose or conduit 116. In some embodiments of the present invention, the structural support member 115 may be structurally coupled to the solder-dispensing device 84 such that the structural support member 115 moves in unison with the solder-dispensing device 84 as the solder-dispensing device 84 is selectively moved in the XY direction using the lateral translation device 124. The generally flexible vacuum hose or conduit 116 may extend between a vacuum pump (not shown in FIG. 2), which may be disposed within a housing 134 of the solder system 110, and a vacuum fixture 90 as previously described herein, which may be disposed on an end 132 of the structural support member 115.

In additional embodiments of the present invention, the vacuum device 114 may be configured to selectively move in the lateral X and Y directions relative to the substrate 120 independently from the solder-dispensing device 84. For example, the solder system 110 may include a second lateral translation device (not shown) similar to the lateral translation device 124, to which the structural support member 115 of the vacuum device 114 may be mounted. In such a configuration, movement of the solder-dispensing device 84 and the vacuum device 114 in the lateral X and Y directions may be independently selectively controlled. In yet additional embodiments, one or both of the solder-dispensing device 84 and the vacuum device 114 may be substantially stationary or fixed, and the substrate fixture 118 may be configured to selectively move in the lateral X and Y directions relative to the substantially stationary or fixed solder-dispensing device 84 and vacuum device 114. For example, the fixture 118, or a support member or frame 119 to which the substrate fixture 118 is mounted may be mounted to a lateral translation device, such as the lateral translation device 124.

Figure 3:
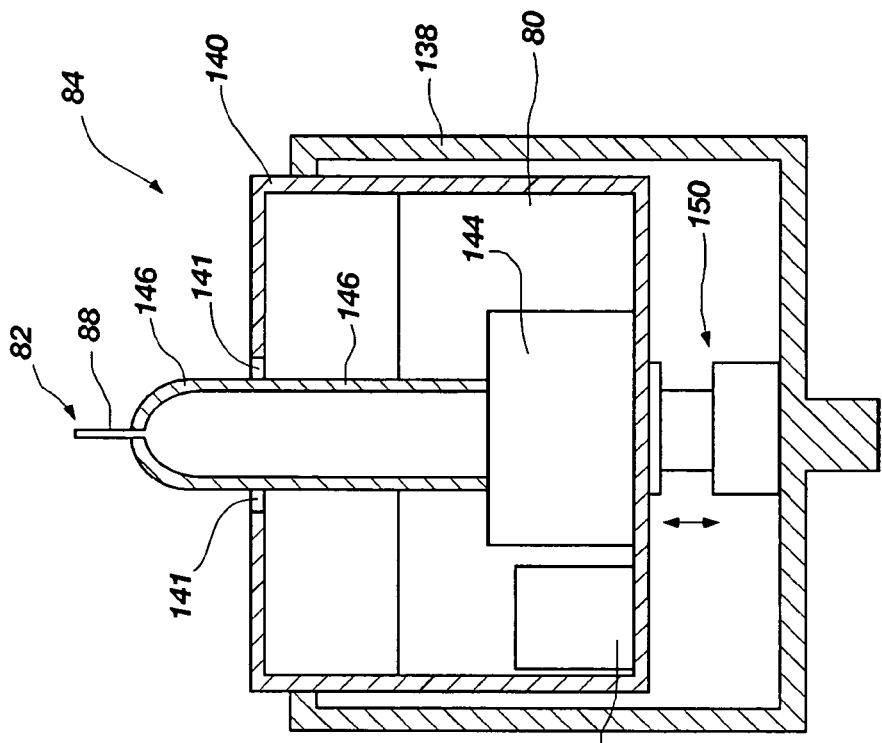
FIG. 3 is a partial cross-sectional view of a soldering device of the system shown in FIG. 2.

FIG. 3 is an enlarged partial cross-sectional view of an example of one embodiment of a solder-dispensing device 84 that may be used with the solder system 110 shown in FIG. 2. As shown in FIG. 3, the solder-dispensing device 84 may include an outer housing 138 in which a solder pot or container 140 is slidably mounted. The container 140 may be at least partially filled with molten solder material 80. The volume of molten solder material 80 in the container 140 may be large enough to minimize or prevent dross (solder oxides) that forms at the surface of the molten solder material 80 from mixing with pristine (dross-free) molten solder material 80 in the container 140. A heater 142 may be used to maintain the temperature of the molten solder material 80 above the melting point of the solder material 80. In some embodiments, the heater 142 may be disposed within the container 140. In additional embodiments, the heater 142 may be disposed outside the container 140 or outside the outer housing 138 of the solder-dispensing device 84. The solder-dispensing device 84 also may include a pump device 144 configured to force molten solder material 80 in the container 140 up through a conduit 146 to an outlet 82 of a nozzle 88 of the solder-dispensing device 84. By way of example and not limitation, the pump device 144 may include an electric motor (which may be disposed inside or outside the solder-dispensing device 84) that is configured and operatively coupled to spin an impeller located within the container 140 and oriented to cause the desired flow of molten solder material 80 up through the conduit 146 to the outlet 82 of the nozzle 88. The impeller may be located and configured so as to reduce or prevent dross from mixing with pristine (dross-free) molten solder material 80 in the container 140. As the molten solder material 80 flows out from the outlet 82, the molten solder material 80 may flow downward along the exterior surface of the conduit 146, through apertures 141 in the container 140 adjacent the conduit 146, and back into the container 140 for recirculation. The heater 142 (or an additional heater device) may also be configured to heat one or more of the pump device 144, the conduit 146, and the outlet 82, as necessary or desired to prevent solidification of the molten solder material 80.

The solder-dispensing device 84 may be configured to selectively move in the vertical Z direction relative to the substrate 120. By way of example and not limitation, a vertical movement device 150, which may include a linearly actuated solenoid, a pneumatic or hydraulic piston or a stepper motor, may be structurally coupled between the outer housing 138 of the solder-dispensing device 84 and the container 140. In this configuration, the vertical movement device 150 is configured to provide relative vertical movement between the substrate 120 and the molten solder wave provided by the solder-dispensing device 84. In other words, selective actuation of the vertical movement device 150 may cause selective movement of the outlet 82 in the vertical Z direction relative to the substrate 120 (FIG. 2). The vacuum device 114 (FIG. 2) also may include a vertical movement device 150 (such as, for example, a linearly actuated solenoid or a pneumatic or hydraulic piston) that is configured to selectively move the vacuum fixture 90 disposed on the end 132 of the structural support member 115 in the vertical Z direction relative to the substrate 120.

Referring again to FIG. 2, the solder system 110 may further include a plurality of sensors (not shown) configured to detect the relative positions of the substrate 120 (or the substrate fixture 118 supporting the substrate 120), the solder-dispensing device 84 (and in particular, the outlet 82), and the vacuum device 114 (and in particular, the vacuum fixture 90. The solder system 110 optionally may include a source of an inert gas (such as, for example, nitrogen) and hoses and nozzles configured to direct the inert gas onto and around the solder-dispensing device 84. In some embodiments, all exposed surfaces of the molten solder material 80 (and, optionally, the substrate 120) may be substantially blanketed by such inert gas during operation of the solder system 110 to reduce or prevent the formation of dross from the molten solder material 80. Furthermore, an additional heater device (not shown) may be used to pre-heat the substrate 120 prior to using the solder-dispensing device 84 and the vacuum device 114 to form conductive vias in the substrate 120.

The solder system 110 may further include a controller 112 that is configured to selectively control one or more of the various components of the solder system 110. By way of example and not limitation, the controller 112 may include a computer device (a desktop computer, a portable computer, etc.) or a programmable logic controller. For example, the controller 112 may be configured to selectively control the lateral translation device 124, the heater 142, pump device 144, and vertical movement device 150 of the solder-dispensing device 84, as well as the various active components of the vacuum device 114 (such as, for example, the vacuum pump (not shown) and the vertical movement device (not shown) configured to move the vacuum fixture 90 in the vertical Z direction relative to the substrate 120).

Various embodiments of the solder system 110, as well as methods of using the solder system 110 to form conductive vias in a workpiece or substrate 120, are described below with reference to FIGS. 4-10.

Figure 4:
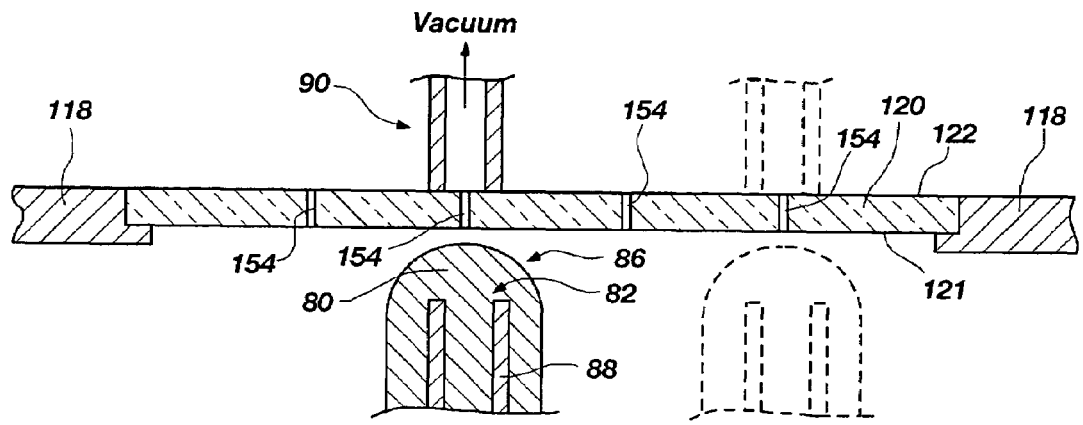
FIG. 4 is a cross-sectional view illustrating a substrate mounted on a substrate fixture of the system shown in FIG. 2, and further illustrating one embodiment of a vacuum fixture and one embodiment of a solder device outlet that each may be used with the system shown in FIG. 2.

Referring to FIG. 4, a workpiece or substrate 120 may be provided in the substrate fixture 118 of the solder system 110 (FIG. 2). The substrate 120 may include a plurality of apertures 154 extending through the substrate 120 between a first side 121 and a second side 122 of the substrate 120. The apertures 154 optionally may include both a via hole 45 and a vent hole 70, as previously described herein in relation to the workpiece 10. A computer file that includes information relating to the dimensions of the substrate 120, as well as the size and location of each of the apertures 154 in the substrate 120, may be stored in memory of the controller 112 of the solder system 110. The controller 112 may be configured under control of a program to form a molten solder wave 86 using the nozzle 88 of the solder-dispensing device 84 and the pump device 144 (FIG. 3), and to position the molten solder wave 86 below a selected aperture 154 using the lateral translation device 124, as shown in FIG. 4. The controller 112 may be configured under control of the program to also position the vacuum fixture 90 above the selected aperture 154, and to generate a vacuum within the vacuum fixture 90 and the selected aperture 154. The nozzle 88 then may be moved towards the substrate 120 using the vertical movement device 150 (FIG. 3) until the molten solder wave 86 contacts the first side 121 of the substrate 120 adjacent the selected aperture 154. After molten solder material 80 has been drawn into the selected aperture 154 to a desired extent, the controller 112 of the solder system 110 may be configured to interrupt contact between the molten solder wave 86 and the first side 121 of the substrate 120. The controller 112 may be further configured under control of a program to sequentially move the nozzle 88 and the vacuum fixture 90 to other selected apertures 154 of the substrate 120, and to repeat the previously described process to form conductive vias in other apertures 154 of the substrate 120. For example, the nozzle 88 and the vacuum fixture 90 may be moved from their relative position shown in FIG. 4 to the relative positions shown in FIG. 4 in broken lines. As previously discussed, in some embodiments, the nozzle 88 of the solder-dispensing device 84 and the vacuum fixture 90 may be configured to move substantially in unison.

Figure 5:
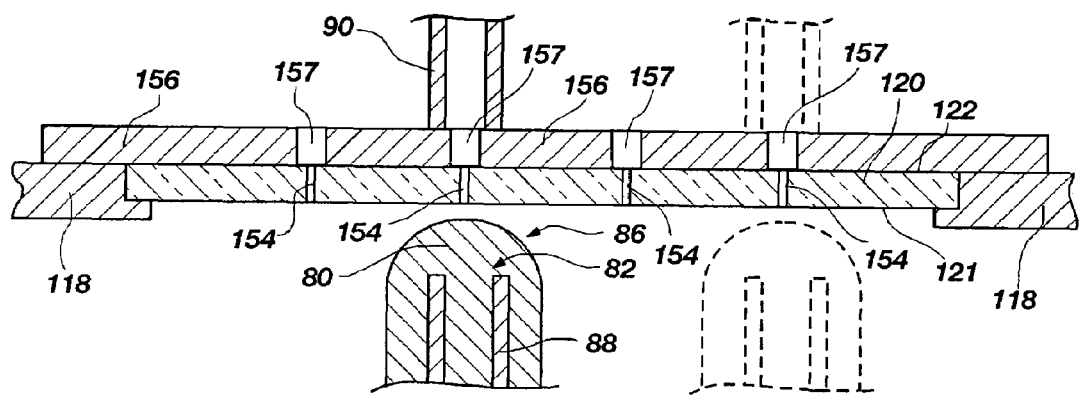
FIG. 5 is a cross-sectional view like that shown in FIG. 4 illustrating a plate member positioned between the substrate and the vacuum fixture.

FIG. 5 is a cross-sectional view like that shown in FIG. 4 illustrating use of a plate member 156 between the substrate 120 and the vacuum fixture 90. The plate member 156 includes a plurality of apertures 157 extending through the plate member 156. The apertures 157 extending through the plate member 156 correspond to and align with the apertures 154 of the substrate 120. In such a configuration, the vacuum fixture 90 may be abutted against the plate member 156 and used to generate a vacuum within one or more of the apertures 157 in the plate member 156 and the corresponding apertures 154 in the substrate 120. The plate member 156 may include a metal material, a ceramic material, or a generally rigid polymer material. Furthermore, the vacuum fixture 90 may be caused to slide along the surface of the plate member 156 as the vacuum fixture 90 is moved between the apertures 157 of the plate member 156 without causing damage to the substrate 120. Optionally, a coating may be applied to the surface of the plate member 156 to reduce friction between the plate member 156 and the vacuum fixture 90 when the vacuum fixture 90 is slid along the surface of the plate member 156. By way of example and not limitation, such a coating may include a polytetrafluoroethylene-based material, a layer of silica, or any other material that exhibits a lower coefficient of friction relative to the vacuum fixture 90 than the bulk material of the plate member 156. Providing a plate member 156 between the substrate 120 and the vacuum fixture 90 may protect the second side 122 of the substrate 120 from damage caused by contact between the vacuum fixture 90 and the substrate 120.

Figure 6:
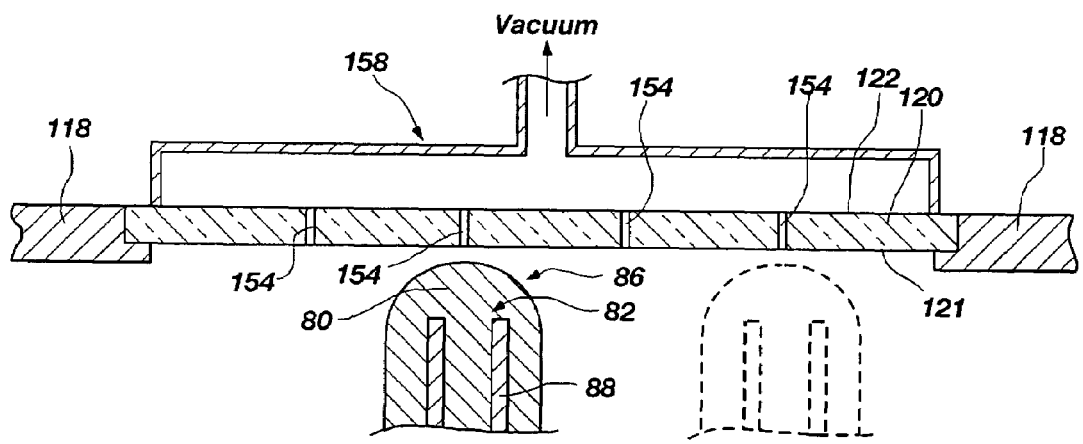
FIG. 6 is a cross-sectional view illustrating another embodiment of a vacuum fixture that may be used with the system shown in FIG. 2.

FIG. 6 is a cross-sectional view like that shown in FIGS. 4-5 illustrating another embodiment of a vacuum fixture 158 that may be used with the solder system 110 shown in FIG. 2. As shown in FIG. 6, the vacuum fixture 158 may have a size and shape configured to cover a plurality of apertures 154 of the substrate 120. In some embodiments, the vacuum fixture 158 may have a size and shape configured to cover all apertures 154 of the substrate 120. The vacuum fixture 158 may be substantially fixed in the lateral X and Y directions (FIG. 2) relative to the substrate 120. In such a configuration, a vacuum may be provided within a plurality of apertures 154 of the substrate 120 substantially simultaneously, and the controller 112 of the solder system 110 may be configured to move only the nozzle 88 of the solder-dispensing device 84 relative to the substrate 120 in the manner previously described to form conductive vias in the apertures 154. For example, the nozzle 88 may be moved from the position shown in FIG. 6 to the position shown in broken lines while the vacuum fixture 158 remains substantially fixed in the position shown in FIG. 6.

Figure 7:
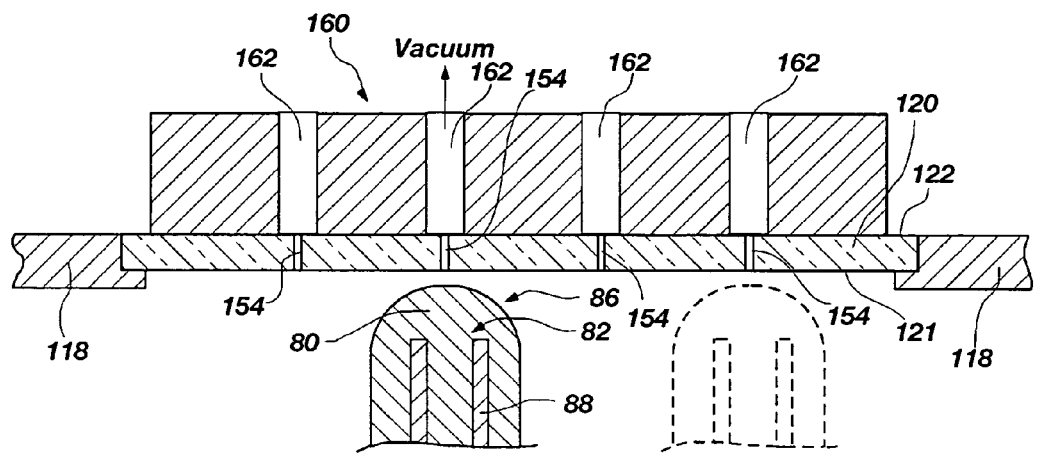
FIG. 7 is a cross-sectional view illustrating yet another embodiment of a vacuum fixture that may be used with the system shown in FIG. 2.

FIG. 7 is a cross-sectional view like those shown in FIGS. 4-6 illustrating yet another embodiment of a vacuum fixture 160 that may be used with the solder system 110 shown in FIG. 2. As shown in FIG. 7, the vacuum fixture 160 may have a size and shape configured to cover a plurality of apertures 154 of the substrate 120. In some embodiments, the vacuum fixture 160 may have a size and shape configured to cover all apertures 154 of the substrate 120. The vacuum fixture 160 may be substantially fixed in the lateral X and Y directions (FIG. 2) relative to the substrate 120. As shown in FIG. 7, the vacuum fixture 160 may be provided with a plurality of cavities 162 therein, each being aligned with and communicating with a single aperture 154 of the substrate 120. In this configuration, the vacuum device 114 (FIG. 2) may include additional vacuum lines, each communicating with a single cavity 162, as well as selectively actuated pressure release valves in each line, such that a vacuum may be selectively independently applied to selected cavities 162. In such a configuration, the controller 112 of the solder system 110 may be configured to move the nozzle 88 of the solder-dispensing device 84 relative to the substrate 120 while the vacuum fixture 160 remains in a fixed position relative to the substrate 120, and to generate or apply a vacuum to the respective cavity 162 and corresponding aperture 154 of the substrate 120 in which a conductive via is to be formed using the nozzle 88 of the solder-dispensing device 84. For example, the nozzle 88 may be moved from the position shown in FIG. 6 to the position shown in broken lines while the vacuum fixture 158 remains substantially fixed in the position shown in FIG. 6, the controller 112 selectively applying a vacuum to the corresponding cavity 162 and aperture 154 at the appropriate time and for a selected duration to fill the aperture 154 with molten solder material 80.

Figure 8:
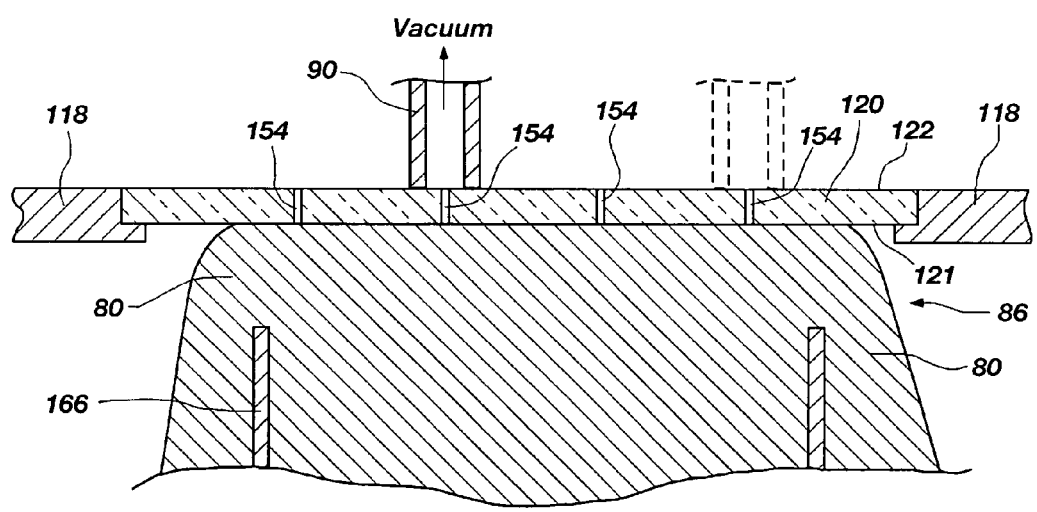
FIG. 8 is a cross-sectional view illustrating another embodiment of a solder device outlet that may be used with the system shown in FIG. 2.

FIG. 8 is a cross-sectional view like those shown in FIGS. 4-7 illustrating another embodiment of a nozzle 166 that may be used with the solder-dispensing device 84 of the solder system 110 shown in FIG. 2. In some embodiments, molten solder material 80 may not significantly enter the apertures 154 of the substrate 120 when the molten solder wave 86 contacts the first side 121 of the substrate 120 in the absence of a vacuum applied within the apertures 154. In such cases, the nozzle 166 of the solder-dispensing device 84 may have a size and shape configured to generate a relatively large molten solder wave 86 that is capable of contacting a relative large area on the first side 121 of the substrate 120 that includes more than one aperture 154. The nozzle 166 may be substantially fixed in the lateral X and Y directions (FIG. 2) relative to the substrate 120, and the molten solder wave 86 may be caused to contact a relatively large area on the first side 121 of the substrate 120 that includes a plurality of apertures 154. The controller 112 of the solder system 110 may be configured to move the vacuum fixture 90 relative to the substrate 120 while the nozzle 166 remains in a substantially fixed position relative to the substrate 120, and to sequentially generate or apply a vacuum within the apertures 154 of the substrate 120 in which a conductive via is to be formed. For example, the vacuum fixture 90 may be moved from the position shown in FIG. 8 to the position shown in broken lines while the nozzle 166 of the solder-dispensing device 84 remains substantially fixed in the position shown in FIG. 8.

Figure 9:
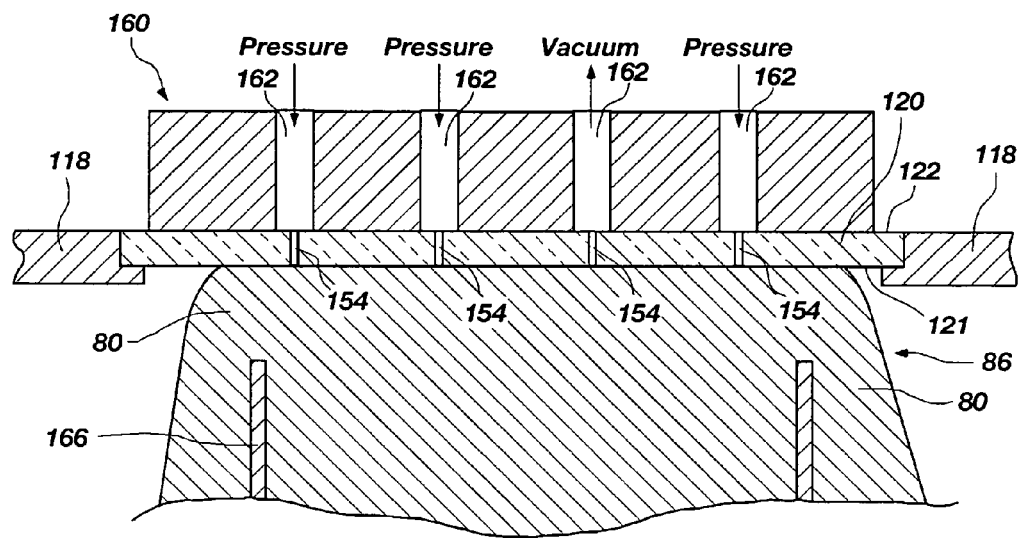
FIG. 9 is a cross-sectional view illustrating a method in which a vacuum fixture like that shown in FIG. 7 may be utilized with a solder device outlet like that shown in FIG. 8.

FIG. 9 is a cross-sectional view like those shown in FIGS. 4-8 illustrating another embodiment of the solder system 110 shown in FIG. 2 that includes a vacuum fixture 160 and a nozzle 166, as each were previously described herein. Each of the vacuum fixture 160 and the nozzle 166 may remain in a substantially fixed location in the lateral X and Y directions relative to the substrate 120. In this configuration, the vacuum device 114 (FIG. 2) may further include a source of pressurized inert gas, as well as a plurality of separate pressure lines (not shown), each corresponding to a cavity 162 of the vacuum fixture 160. Each of the separate pressure lines may communicate with one cavity 162 of the vacuum fixture 160, as well as with the source of pressurized inert gas and a vacuum pump through a selectively actuated three-way pressure valve (not shown). In this configuration, the controller 112 of the solder system 110 may be configured to move only the nozzle 166 in the vertical Z direction to cause the molten solder wave 86 to contact a relatively large region on the first side 121 of the substrate 120 that includes a plurality of apertures 154. The controller 112 of the solder system 110 may be configured to pressurize a plurality of the cavities 162 and corresponding apertures 154 of the substrate 120 using the source of pressurized inert gas to prevent molten solder material 80 from entering into those apertures 154, while substantially simultaneously generating a vacuum within one or more of the other cavities 162 and corresponding apertures 154 of the substrate 120 to draw molten solder material 80 into those cavities to form conductive vias therein.

One advantage of various embodiments of the present invention disclosed herein is the ability to apply molten solder materials 80 having different material compositions to different apertures 154 of the substrate 120 without shutting down the solder system 110 to change the solder material within the container 140 of the solder-dispensing device 84. Various solder materials having different compositions are known in the art. One solder material may exhibit one or more characteristics that are preferable or desirable relative to other solder materials. The solder material exhibiting the preferred characteristics, however, may be more expensive than other solder materials. As substrates 120 typically include a plurality of conductive vias, the performance of some conductive vias in one or more aspects may be relatively critical compared to other conductive vias of the substrate 120. As a result, it would be desirable to provide a solder system 110 that may be used to apply a first solder material having a first composition to one or more apertures 154 in a substrate 120, and to apply a second solder material having a second composition to other apertures 154 in the substrate 120.

Figure 10:
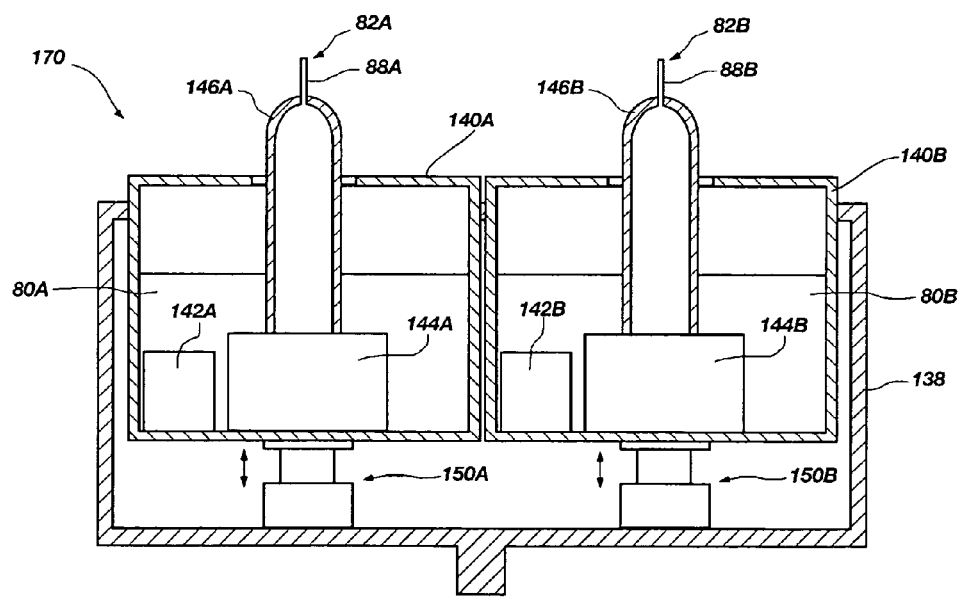
FIG. 10 is a partial cross-sectional view of another soldering device that may be used with the system shown in FIG. 2 and that includes two solder device outlets for dispensing different solder materials therefrom.

FIG. 10 is an enlarged partial cross-sectional view of an example of another solder-dispensing device 170 that may be used with the solder system 110 shown in FIG. 2 and that embodies teachings of the present invention. As shown in FIG. 10, the solder-dispensing device 170 is generally similar to the solder-dispensing device 84 previously described in relation to FIG. 3, and may include an outer housing 138. The solder-dispensing device 170, however, includes a first container 140A and a second container 140B. The first container 140A may be filled with a first molten solder material 80A having a first composition, and the second container 140B may be filled with a second molten solder material 80B having a second composition. Each of the containers 140A, 140B may include a respective heater 142A, 142B and a respective pump device 144A, 144B, as shown in FIG. 10. The pump device 144A in the first container 140A may be configured to force the first molten solder material 80A up through a first conduit 146A to an outlet 82A of a first nozzle 88A of the solder-dispensing device 170. Similarly, the pump device 144B in the second container 140B may be configured to force the second molten solder material 80B up through a second conduit 146B to an outlet 82B of a second nozzle 88B of the solder-dispensing device 170. A first vertical movement device 150A, such as, for example, a linearly actuated solenoid, a pneumatic or hydraulic piston or a stepper motor, may be structurally coupled between the outer housing 138 of the solder-dispensing device 170 and the first container 140A. Similarly, a second vertical movement device 150B, such as, for example, a linearly actuated solenoid, a pneumatic or hydraulic piston or a stepper motor, may be structurally coupled between the outer housing 138 of the solder-dispensing device 170 and the second container 140B. In this configuration, selective independent actuation of the vertical movement devices 150A, 150B causes selective movement of the outlets 82A, 82B in the vertical Z direction relative to the substrate 120 (FIG. 2).

In one embodiment, set forth merely as an example, the first molten solder material 80A may include a tin-silver-copper solder alloy, and the second molten solder material 80B may include a gold-tin solder alloy.

Figure 11:
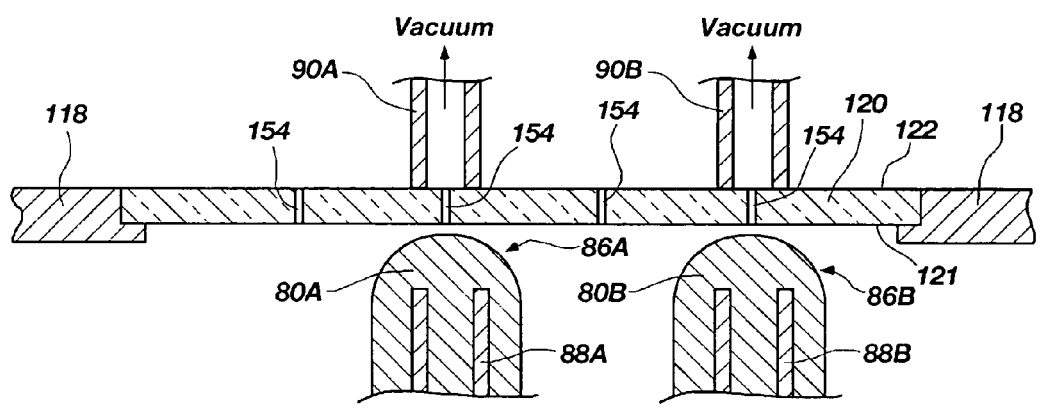
FIG. 11 is a cross-sectional view illustrating use of the soldering device shown in FIG. 10 with the system shown in FIG. 2 to form conductive vias in a substrate.

FIG. 11 is a cross-sectional view like that shown in FIG. 4 illustrating use of the solder-dispensing device 170 shown in FIG. 10 to form conductive vias in a substrate 120 using the solder system 110 (FIG. 2). As shown in FIG. 11, the first nozzle 88A may be used to form a first molten solder wave 86A comprising a first molten solder material 80A having a first composition, and the second nozzle 88B may be used to form a second molten solder wave 86B comprising a second molten solder material 80B having a second composition. As also shown in FIG. 11, in some embodiments, the solder system 110 may also include a first vacuum fixture 90A corresponding to the first nozzle 88A and a second vacuum fixture 90B corresponding to the second nozzle 88B. The controller 112 of the solder system 110 may be configured to first form a first plurality of conductive vias in a first plurality of apertures 154 of the substrate 120 using the first molten solder wave 86A and the first vacuum fixture 90A, and to then form a second plurality of conductive vias in a second plurality of apertures 154 of the substrate 120 using the second molten solder wave 86B and the second vacuum fixture 90B.

In additional embodiments, the solder system 110 may include a single vacuum fixture 90 configured to move independently of both the first nozzle 88A and the second nozzle 88B. Furthermore, any of the vacuum fixtures previously described herein (i.e., the vacuum fixture 90 described with reference to FIG. 4, the vacuum fixture 158 described with reference to FIG. 6, the vacuum fixture 160 described with reference to FIG. 7 and FIG. 9) may be used with the solder-dispensing device 170 and the solder system 110 in any of the previously described manners. In addition, it is not necessary that the solder system 110 fill each aperture 154 to be filled with the first solder material 80A before filling any apertures 154 with the second solder material 80B, and it is contemplated that the apertures 154 of the substrate 120 may be filled in any sequence, the controller 112 of the solder system 110 selectively aligning and actuating the appropriate nozzle 88A, 88B to fill each aperture 154 with the molten solder material 80A, 80B previously selected for each respective aperture 154.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A method of forming a conductive via in a substrate, the method comprising:
   forming at least one aperture through a substrate from a first surface of the substrate to a second surface of the substrate;
   flowing molten solder material out from an outlet of a molten solder-dispensing device in a flow direction generally against a direction of a gravitational field to form a molten solder wave;
   contacting the substrate with the molten solder wave; and
   providing a vacuum within the at least one aperture to draw molten solder material into the at least one aperture from the molten solder wave.

2. The method of claim 1, wherein forming at least one aperture through a substrate comprises forming a plurality of apertures through the substrate.

3. The method of claim 2, wherein providing a vacuum within the at least one aperture to draw molten solder material into the at least one aperture comprises selectively drawing molten solder material into one aperture of the plurality of apertures without drawing molten solder material into other apertures of the plurality of apertures.

4. The method of claim 2, wherein providing a vacuum within the at least one aperture comprises simultaneously providing a vacuum within each aperture of the plurality of apertures, and wherein contacting the substrate with the molten solder wave comprises selectively filling one aperture of the plurality of apertures with molten solder material without simultaneously filling other apertures of the plurality of apertures with molten solder material.

5. The method of claim 2, further comprising pressuring at least one aperture of the plurality of apertures while simultaneously providing the vacuum within the at least one aperture of the plurality of apertures.

6. The method of claim 5, wherein pressuring at least one aperture of the plurality of apertures comprises pressurizing substantially all apertures of the plurality of apertures in which a vacuum is not provided.

7. The method of claim 2, wherein providing a vacuum within the at least one aperture comprises providing a vacuum fixture adjacent the second surface of the substrate, and wherein contacting the substrate with the molten solder wave comprises contacting the first surface of the substrate with the molten solder wave.

8. The method of claim 1, wherein forming at least one aperture through a substrate comprises:
   forming a via hole partially through the substrate from the first surface of the substrate; and
   forming a vent hole extending between the via hole and the second surface of the substrate.

9. The method of claim 8, wherein forming the vent hole comprises laser drilling the vent hole.

10. The method of claim 8, wherein providing a vacuum within the at least one aperture comprises abutting a vacuum fixture against the second surface of the substrate proximate the vent hole, and wherein contacting the substrate with the molten solder wave comprises contacting the first surface of the substrate with the molten solder wave.

11. The method of claim 10, further comprising configuring the outlet of the molten solder-dispensing device to have a size and shape to provide a molten solder wave having a size and shape capable of contacting an area on the first surface of the substrate comprising only a single aperture of the plurality of apertures.

12. The method of claim 1, further comprising applying at least one layer of material over at least one surface of the substrate within the at least one aperture prior to contacting the substrate with the molten solder wave and providing a vacuum within the at least one aperture to draw molten solder material into the at least one aperture.

13. The method of claim 12, wherein applying at least one layer of material comprises applying a layer of electrically insulating material.

14. The method of claim 12, wherein applying at least one layer of material further comprises applying a layer of solder wettable material.

15. The method of claim 12, wherein applying at least one layer of material further comprises applying at least one of a layer comprising a noble metal, a layer comprising an adhesion material, and a layer comprising a barrier material.

16. The method of claim 1, wherein forming at least one aperture through a substrate comprises forming at least one aperture through a semiconductor die, a semiconductor wafer, or a partial semiconductor wafer.

17. A method of forming a conductive via in a substrate, the method comprising:
    forming at least one via hole in a substrate from a first surface thereof;
    forming a vent hole extending between a second surface of the substrate and the at least one via hole;
    flowing conductive liquid material out from an outlet of a dispensing device in a flow direction generally against a direction of a gravitational field to form a wave of conductive liquid material;
    contacting the first surface of the substrate with the wave of conductive liquid material;
    providing a vacuum adjacent the vent hole at the second surface of the substrate to draw liquid material from the wave of conductive liquid material into the via hole; and
    solidifying the conductive liquid material within the via hole to form an electrically conductive structure within the via hole.

18. The method of claim 17, wherein flowing conductive liquid material out from an outlet of a dispensing device comprises flowing molten solder material out from an outlet of the dispensing device, and wherein solidifying the conductive liquid material comprises cooling the molten solder material.

19. The method of claim 17, wherein flowing conductive liquid material out from an outlet of a dispensing device comprises flowing conductive liquid material out from an outlet of a dispensing device, the outlet having a generally circular cross-sectional shape.

20. The method of claim 19, wherein the outlet has an average inner diameter of less than about 100 microns.

21. The method of claim 17, wherein contacting the first surface of the substrate with the wave of conductive liquid material comprises moving the wave of conductive liquid material relative to the substrate and providing a vacuum adjacent each vent hole of a plurality of vent holes at the second surface of the substrate to draw conductive liquid material from the wave of conductive liquid material into each via hole of a plurality of via holes.

22. The method of claim 17, wherein flowing conductive liquid material out from an outlet of a dispensing device comprises forming a wave of conductive liquid material having a size and shape capable of contacting an area on the first surface of the substrate comprising only a single via hole of a plurality of via holes.

23. The method of claim 17, wherein providing a vacuum adjacent the vent hole at the second surface of the substrate comprises abutting a vacuum fixture against the second surface of the substrate.

24. A method of forming at least one conductive via in a substrate, the method comprising:
    forming a plurality of apertures through a substrate from a first surface of the substrate to a second surface of the substrate;
    providing a plate member against the second surface of the substrate, the plate member including a plurality of holes extending through the plate member and aligned with the plurality of apertures of the substrate;
    abutting a vacuum fixture against the plate member on a side thereof opposite the substrate;
    contacting the substrate with molten solder material; and
    providing a vacuum within the vacuum fixture and within at least one aperture of the plurality of apertures to draw molten solder material into the at least one aperture.

25. The method of claim 24, further comprising sliding the vacuum fixture across the plate member and sequentially providing a vacuum within each aperture of the plurality of apertures.

26. The method of claim 24, wherein forming a plurality of apertures through a substrate from a first surface of the substrate to a second surface of the substrate comprises:
    forming a plurality of via holes partially through the substrate from the first surface of the substrate; and
    forming a plurality of vent holes extending between the via holes and the second surface of the substrate.

27. The method of claim 24, wherein contacting the substrate with molten solder material comprises:
    flowing molten solder material out from an outlet of a molten solder-dispensing device in a flow direction generally against a direction of a gravitational field to form a molten solder wave; and
    contacting the substrate with the molten solder wave.

28. The method of claim 27, wherein contacting the substrate with the molten solder wave comprises moving the molten solder wave relative to the substrate in unison with the vacuum fixture to sequentially draw molten solder material into each aperture of the plurality of apertures.

29. The method of claim 24, wherein forming a plurality of apertures through a substrate comprises forming a plurality of apertures through a semiconductor die or wafer.

30. A method of forming a plurality of conductive vias in a substrate, the method comprising:
    forming a plurality of apertures through a substrate from a first surface of the substrate to a second surface of the substrate;
    providing a vacuum within at least one aperture of the plurality of apertures;
    selectively contacting the substrate with a first molten solder material having a first composition to selectively draw the first molten solder material into the at least one aperture;
    providing a vacuum within at least another aperture of the plurality of apertures; and selectively contacting the substrate with a second molten solder material having a second composition to selectively draw the second molten solder material into the at least another aperture.

31. The method of claim 30, further comprising substantially simultaneously contacting the substrate with a first molten solder material having a first composition to selectively draw the first molten solder material into the at least one aperture and contacting the substrate with a second molten solder material having a second, different composition to selectively draw the second molten solder material into the at least another aperture.

32. The method of claim 30, further comprising:

flowing the first molten solder material out from an outlet of a first solder-dispensing device in a flow direction generally against a direction of a gravitational field to form a first molten solder wave; and flowing the second molten solder material out from an outlet of a second solder-dispensing device in a flow direction generally against a direction of a gravitational field to form a second molten solder wave.

\* \* \* \* \*